US010483202B2

(12) United States Patent
Aburada et al.

(10) Patent No.: US 10,483,202 B2
(45) Date of Patent: Nov. 19, 2019

(54) SEMICONDUCTOR DEVICE HAVING A WIRING LINE WITH AN END PORTION HAVING ROUNDED SIDE SURFACES AND MANUFACTURING METHOD THEREOF

(71) Applicant: TOSHIBA MEMORY CORPORATION, Minato-ku (JP)

(72) Inventors: Ryota Aburada, Sagamihara (JP); Fumiharu Nakajima, Yokohama (JP); Weiting Wang, Kawasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/255,981

(22) Filed: Sep. 2, 2016

(65) Prior Publication Data
US 2017/0243818 A1    Aug. 24, 2017

Related U.S. Application Data

(60) Provisional application No. 62/298,134, filed on Feb. 22, 2016.

(51) Int. Cl.
*H01L 23/528* (2006.01)
*H01L 21/768* (2006.01)
(Continued)

(52) U.S. Cl.
CPC ........ *H01L 23/528* (2013.01); *H01L 21/0337* (2013.01); *H01L 21/31144* (2013.01);
(Continued)

(58) Field of Classification Search
CPC ............. H01L 23/528; H01L 21/76816; H01L 23/5283; H01L 21/0337; H01L 2224/1412;
(Continued)

(56) References Cited

U.S. PATENT DOCUMENTS 8,298,928 B2    10/2012    Yanagidaira et al.
8,765,610 B2     7/2014    Shini
(Continued)

FOREIGN PATENT DOCUMENTS

JP    8-55908       2/1996
JP    2009-146966   7/2009
(Continued)

*Primary Examiner* — Nelson Garces
(74) *Attorney, Agent, or Firm* — Oblon, McClelland, Maier & Neustadt, L.L.P.

(57) ABSTRACT

A semiconductor device includes a first to a third wiring-line. The first wiring-line is provided on a first layer in a first direction. The second wiring-line is provided on the first layer in the first direction. A first side surface of the second wiring-line faces the first wiring-line. A second side surface of the second wiring-line is opposite to the first side surface. The third wiring-line is provided on the first layer in the first direction, and faces the second side surface of the second wiring-line. An end portion of the first wiring-line projects further from an end portion of the second wiring-line in the first direction. The end portion of the second wiring-line projects further from an end portion of the third wiring-line in the first direction, and curves toward the third wiring-line. Alternatively, the end portion of the second wiring-line increases in width toward its edge portion.

10 Claims, 22 Drawing Sheets

(51) Int. Cl.
    *H01L 27/11519*    (2017.01)
    *H01L 27/11565*    (2017.01)
    *H01L 21/033*     (2006.01)
    *H01L 21/311*     (2006.01)

(52) U.S. Cl.
    CPC .... *H01L 21/76816* (2013.01); *H01L 23/5283* (2013.01); *H01L 27/11519* (2013.01); *H01L 27/11565* (2013.01)

(58) Field of Classification Search
    CPC ..... H01L 2224/2512; H01L 2224/3012; H01L 2224/4112; H01L 2224/4912; H01L 2224/06138; H01L 2224/06139; H01L 2224/06148; H01L 2224/06149; H01L 2224/06189; H01L 23/49838; H01L 29/0692; H01L 2224/1416; H01L 2224/1716; H01L 2224/3016; H01L 2224/3316; H01L 21/67161; H01L 2224/0612; H01L 29/0869; H01L 27/1237; H01L 2224/06158; H01L 2224/06159; H01L 2224/06168; H01L 2224/06169; H01L 2224/06188; H01L 27/124; H01L 23/5386; H01L 27/11504; H01L 27/11519; H01L 27/11565; H01L 27/11587; H01L 21/31144; H02M 7/003; H05K 2201/09; H05K 2201/09254; H05K 2201/09209; H05K 2201/09272; H05K 2201/09009; H04N 1/00456; H01H 2085/2075; H01B 13/01227; H01B 13/01245
    USPC ................................................. 257/773–775
    See application file for complete search history.

(56) References Cited

U.S. PATENT DOCUMENTS

| | | | |
|---|---|---|---|
| 2006/0157833 A1* | 7/2006 | Mashita | G03F 1/36 257/678 |
| 2007/0085847 A1* | 4/2007 | Shishido | G09G 3/3233 345/204 |
| 2010/0038795 A1* | 2/2010 | Aburada | H01L 21/0337 257/773 |
| 2016/0254256 A1* | 9/2016 | Baek | H01L 27/0207 257/401 |

FOREIGN PATENT DOCUMENTS

| | | |
|---|---|---|
| JP | 2013-65772 | 4/2013 |
| JP | 2014-170881 | 9/2014 |

\* cited by examiner

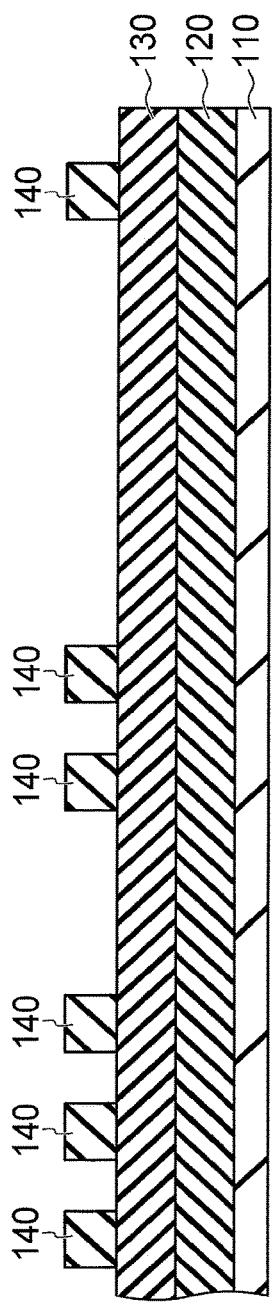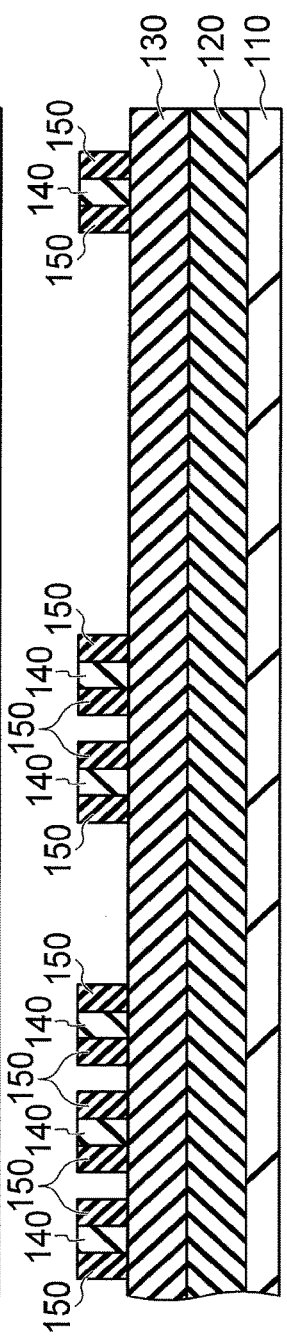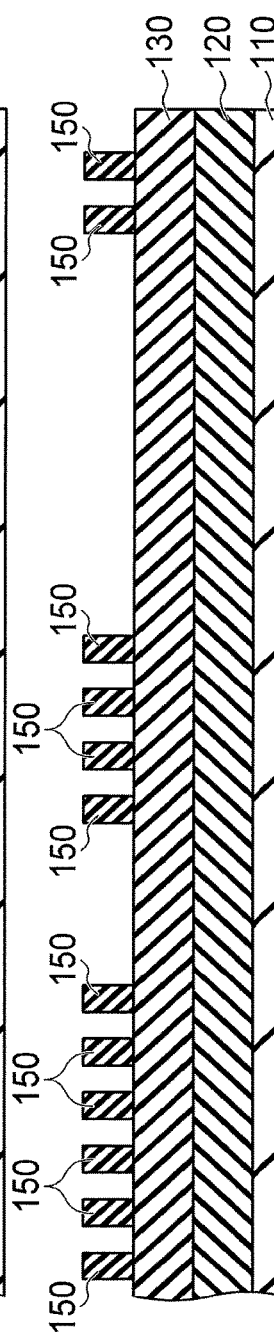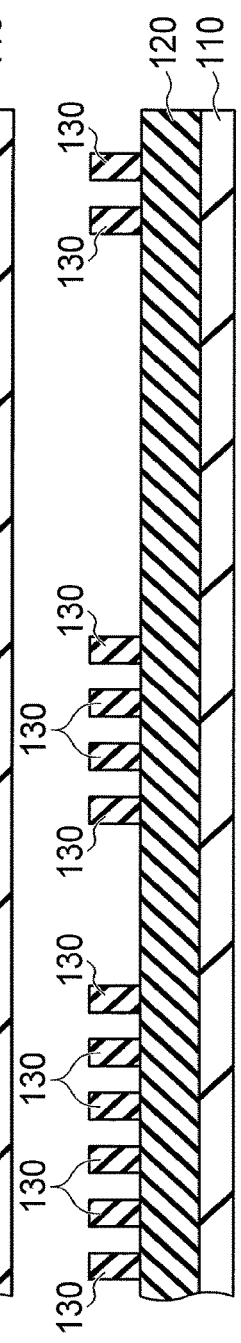

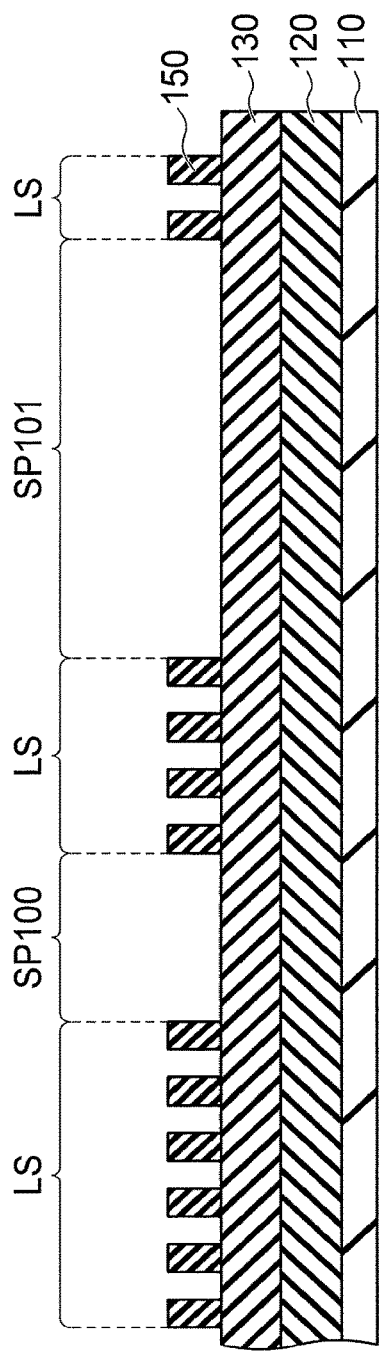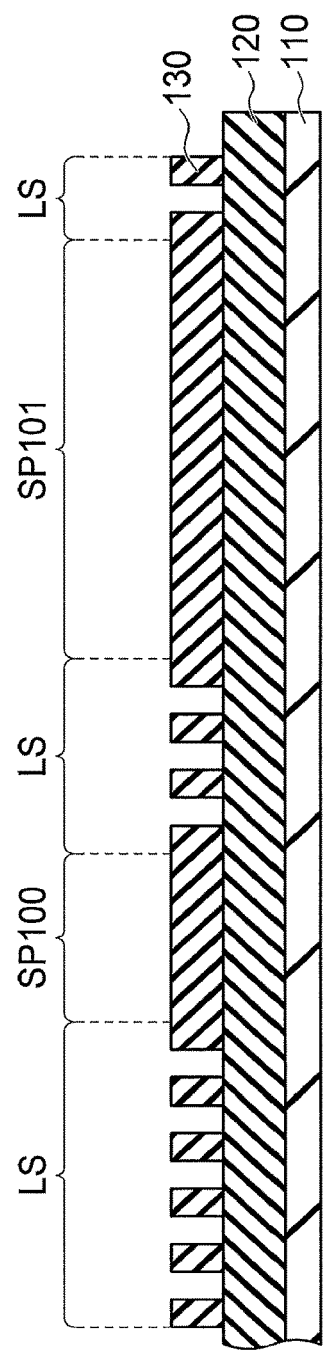

SEMICONDUCTOR DEVICE HAVING A WIRING LINE WITH AN END PORTION HAVING ROUNDED SIDE SURFACES AND MANUFACTURING METHOD THEREOF

CROSS REFERENCE TO RELATED APPLICATIONS

This application is based upon and claims the benefit of priority from the prior U.S. Provisional Patent Application No. 62/298,134, filed on Feb. 22, 2016, the entire contents of which are incorporated herein by reference.

FIELD

The embodiments of the present invention relate to a semiconductor device and a manufacturing method thereof.

BACKGROUND

Sidewall transfer methods have recently been developed in the art of manufacturing semiconductor devices. By a sidewall transfer method, a pattern with a size smaller than a minimum feature size (resolution limit width) in photolithography is formed. A sidewall material is disposed around a core material, and layers of the sidewall material (sidewalls) on side surfaces of the core material are connected to each other at end portions of the core material to form a loop shape. As a result, the sidewalls make a closed loop pattern. If a wiring line pattern is formed using this closed loop pattern, adjacent two wiring lines are electrically short-circuited. In order to avoid this, a process of cutting the closed loop pattern to disconnect the two wiring lines ("loop cut process") is needed.

Conventionally, the loop cut process has been performed using a loop cut mask pattern formed with a photolithographic technique. The size of the closed loop pattern, however, is smaller than the minimum feature size in photolithography. Therefore, it has been difficult to expose the mask pattern to conform to the closed loop pattern. On the other hand, if a margin is obtained in a portion around the closed loop pattern to enable the exposure of the mask pattern, the area penalty in this portion increases.

BRIEF DESCRIPTION OF THE DRAWINGS

FIGS. 18A to 19C are cross-sectional views showing a method of manufacturing a semiconductor device according to the fourth embodiment;

FIGS. 21A to 22C are cross-sectional views illustrating a semiconductor device manufacturing method according to a second modification of the fourth embodiment;

DETAILED DESCRIPTION

Embodiments will now be explained with reference to the accompanying drawings. The present invention is not limited to the embodiments.

A semiconductor device according to an embodiment includes a first wiring line, a second wiring line, and a third wiring line. The first wiring line is provided on a first layer in a first direction. The second wiring line is provided on the first layer in the first direction. A first side surface of the second wiring line faces the first wiring line. A second side surface of the second wiring line is opposite to the first side surface. The third wiring line is provided on the first layer in the first direction, and faces the second side surface of the second wiring line. An end portion of the first wiring line projects further from an end portion of the second wiring line in the first direction. The end portion of the second wiring line projects further from an end portion of the third wiring line in the first direction, and curves toward the third wiring line. Alternatively, the end portion of the second wiring line increases in width toward its edge portion.

(First Embodiment)

FIGS. 1A to 6B are plan views and cross-sectional views illustrating a semiconductor device manufacturing method according to a first embodiment. FIGS. 1A, 2A, 3A, 4A, 5A, and 6A are plan views, and FIGS. 1B, 2B, 3B, 4B, 5B, and 6B are cross-sectional views. FIGS. 1B, 2B, 3B, 4B, 5B, and 6B illustrate cross sections taken along lines B-B in FIGS. 1A, 2A, 3A, 4A, 5A, and 6A, respectively.

The first embodiment is a process of forming a wiring line pattern on an object film 10 to be processed using a sidewall transfer method. This embodiment may be applied to form minute patterns other than the wiring line pattern.

First, a material of core members 20, a first material, is deposited on the object film 10. The object film 10 is, for example, an insulating film such as a silicon oxide film. The material of core members 20 is, for example, polycrystalline silicon or silicon nitride, which may be selectively etched with respect to the object film 10.

Figure 1A:
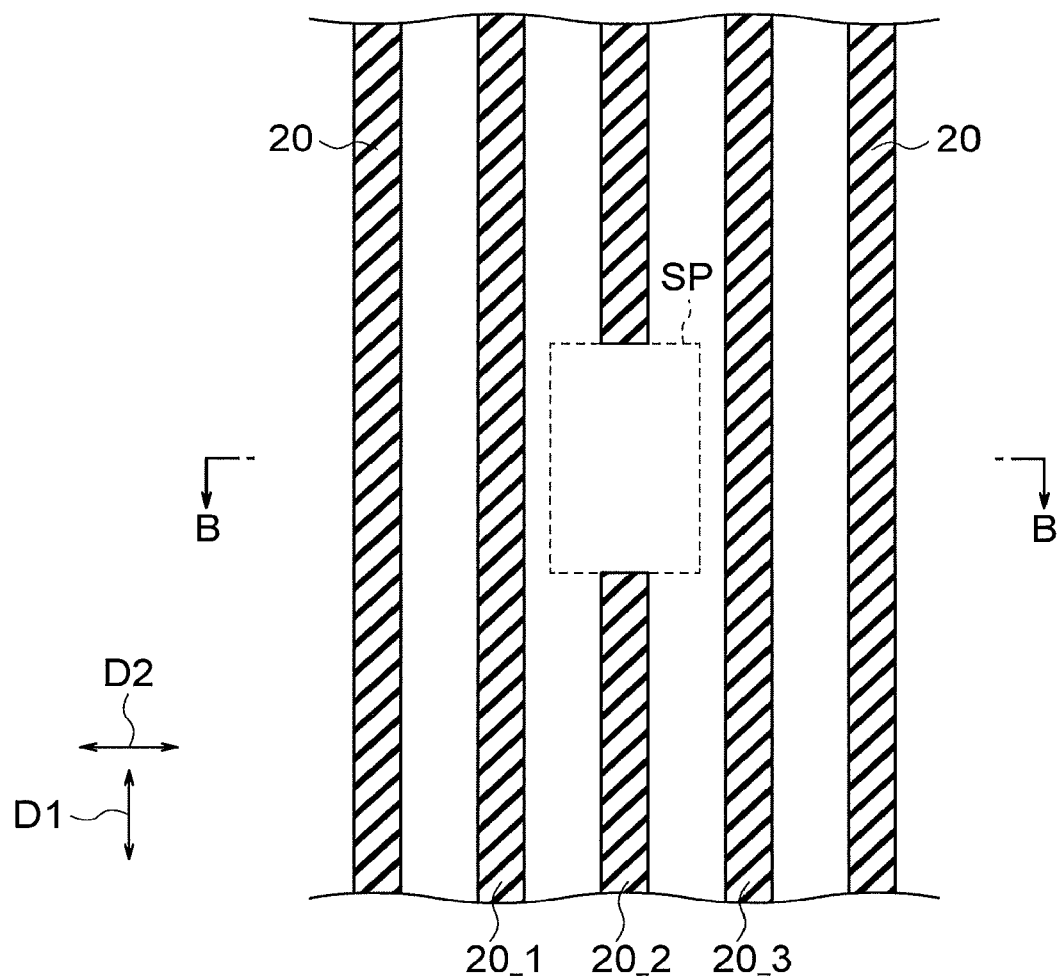
FIGS. 1A to 6B are plan views and cross-sectional views illustrating a semiconductor device manufacturing method according to a first embodiment.
Figure 1B:
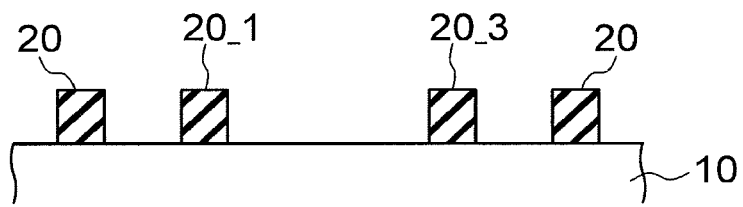

The material of core members 20 is processed using a photolithographic technique. As a result, core members 20, which are in a line pattern extending in a first direction D1, are formed as shown in FIG. 1A. Among line pattern elements in the line pattern, a first line pattern element 20_1, a second line pattern element 20_2, and a third line pattern element 20_3 are disposed to be adjacent to one another in a second direction D2 that crosses the first direction D1. The second line pattern element 20_2 is not present in a portion between the first line pattern element 20_1 and the third line pattern element 20_3, and there is a space region SP in this portion. Accordingly, FIG. 1B does not show the second line pattern element 20_2.

Figure 2A:
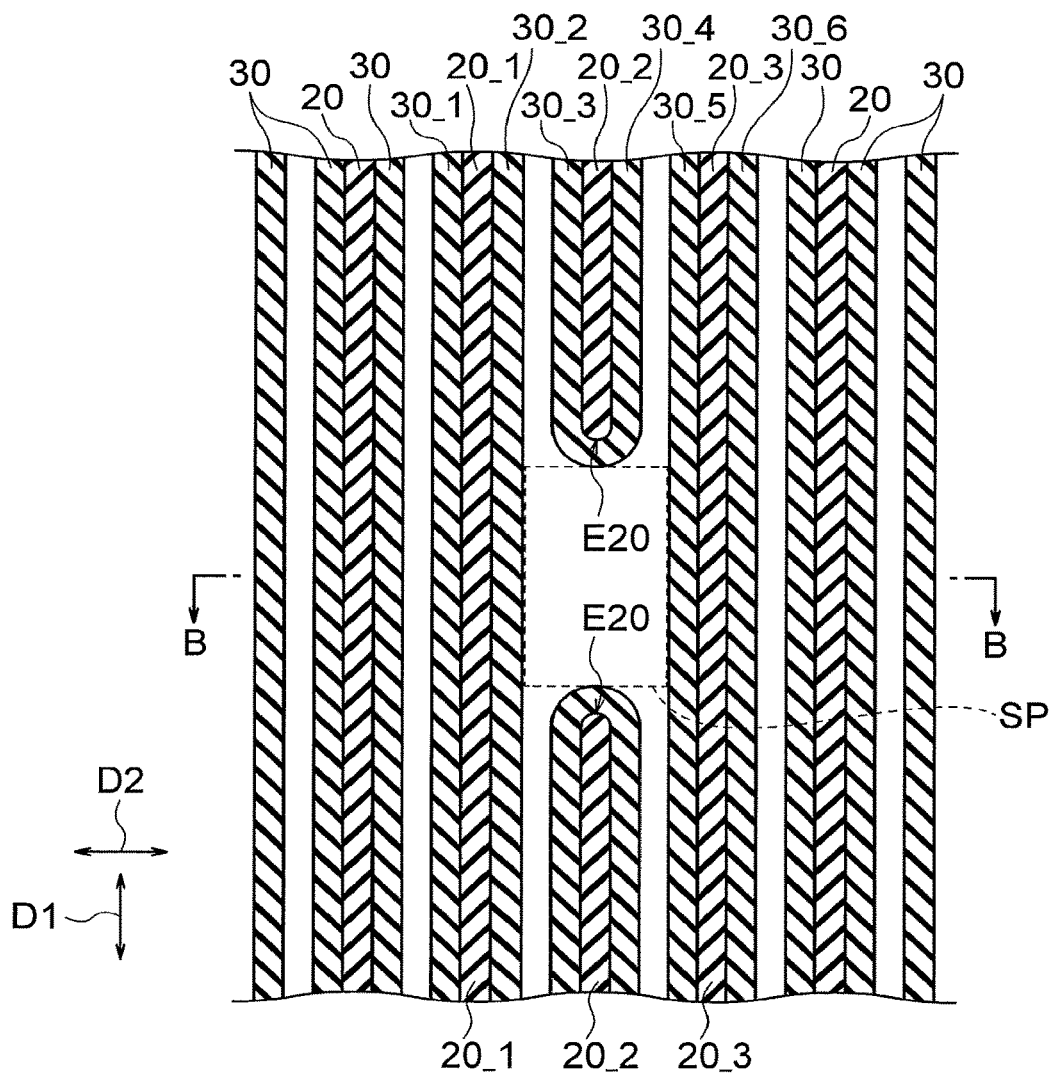
Figure 2B:
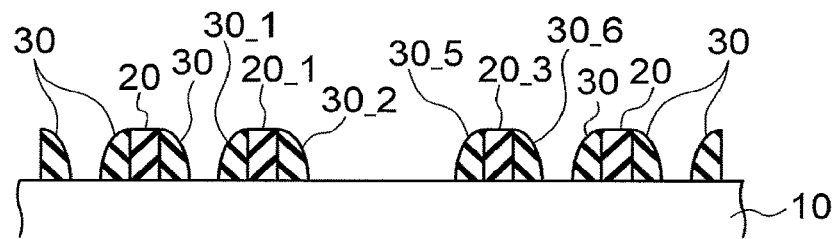

Side surfaces of the core members 20 are etched (slimmed) to reduce the width of each core member 20. A material of sidewall films 30 is then deposited on the top surfaces and the side surfaces of the slimmed core members 20, and etching back of the material of sidewall films 30 is performed. The material of sidewall films 30 may be selectively etched with respect to the object film 10 and the core members 20, and may be, for example, silicon nitride or polycrystalline silicon. As a result, the sidewall films 30 are left on the side surfaces of the core members 20 as shown in FIGS. 2A and 2B. The sidewall films 30 at opposite side surfaces of the second line pattern element 20_2 are connected to each other at an end portion E20 of the second line pattern element 20_2 facing the space region SP. The sidewall film 30, therefore, surrounds the end portion E20 from one of the side surfaces of the second line pattern element 20_2 to the other. In other words, the sidewall film 30 has a loop pattern or U-shape pattern to surround the end portion E20 of the second line pattern element 20_2. The sidewall films at both sides of the first line pattern element 20_1 are denoted by 30_1 and 30_2, the sidewall films between the first line pattern element 20_1 and the second line pattern element 20_2 are denoted by 30_2 and 30_3, the sidewall films between the second line pattern element 20_2 and the third line pattern element 20_3 are denoted by 30_4 and 30_5, and sidewall films at both sides of the third line pattern element 20_3 are denoted by 30_5 and 30_6, as shown in FIG. 2A.

Figure 3A:
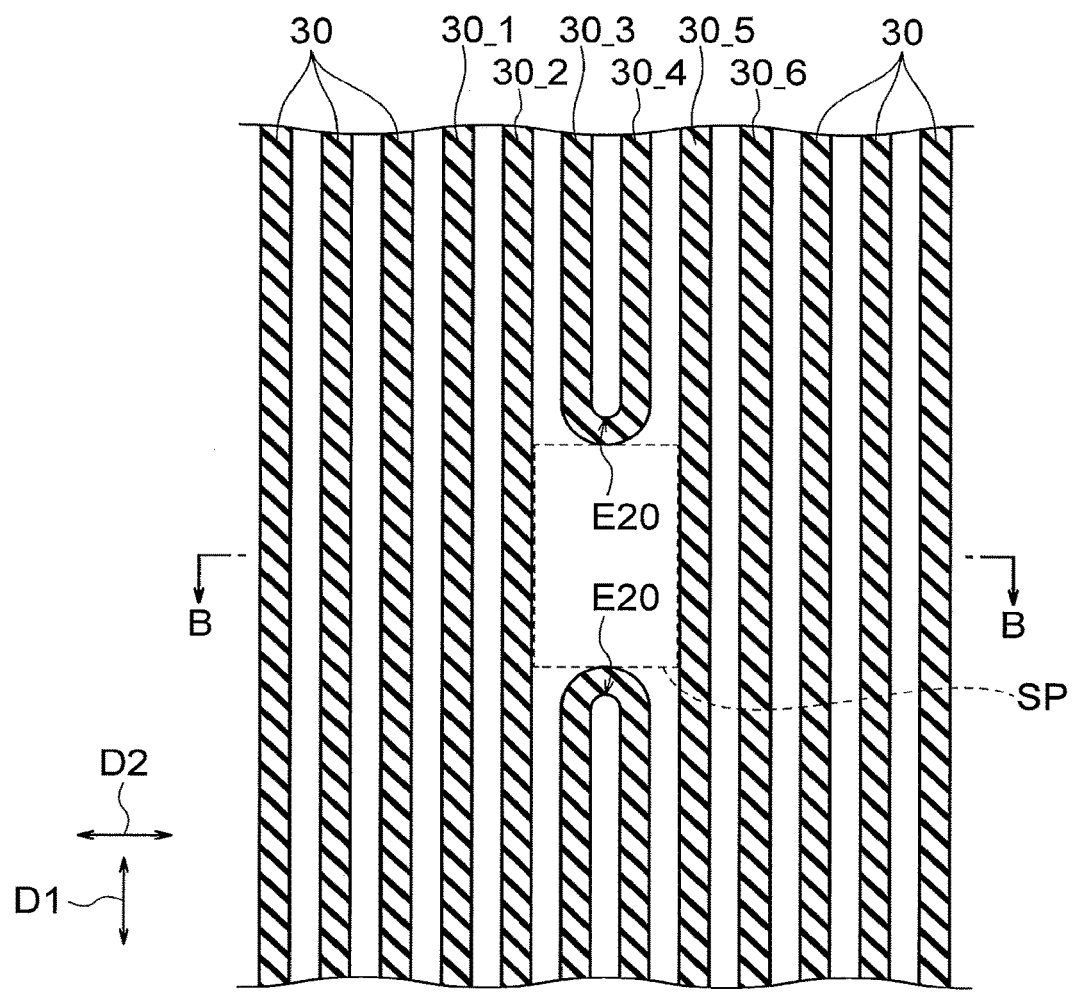
Figure 3B:
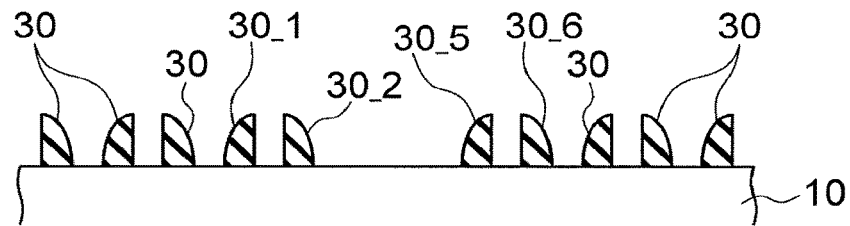

Thereafter, the core members 20 are selectively removed. As a result, the sidewall films 30 are left on the object film 10 as shown in FIGS. 3A and 3B. The sidewall films 30 having a loop pattern or U-shape pattern at the end portion E20 are left in the same shape.

Subsequently, the object film 10 is processed using the sidewall films 30 as masks. The object film 10 is etched in portions exposed between adjacent sidewall films 30, and groove (or trench) pattern elements TR are formed. The object film 10 is etched by an etching technique employing an inverse loading effect.

The inverse loading effect is a phenomenon in which an object film to be processed under a mask pattern is etched if the size of space regions where no mask pattern (no sidewall film 30) is present is smaller than a predetermined value, and the object film is not etched very much if the size of the space regions is more than a predetermined value. The width of the space region SP causing the inverse loading effect varies depending on the material to be processed and the etching conditions. Therefore, the width between the sidewall films 30 is adjusted to determine the width of the space region SP, with which the object film 10 is left in the space region SP.

The object film 10 is etched using this inverse loading effect. As a result, the object film 10 is etched relatively deeply in a region that is narrower than the minimum feature size in lithography (the region between the sidewall film 30_1 and the sidewall film 30_2, and the region between the sidewall film 30_3 and the sidewall film 30_4). On the other hand, the object film 10 is not etched much in the space region SP, the width of which is relatively large. Therefore, the object film 10 is etched more deeply in the regions between the sidewall film 30_1 and the sidewall film 30_2 and between the sidewall film 30_3 and the sidewall film 30_4 than in the space region SR As a result, the groove pattern elements TR are formed in the regions between the sidewall film 30_1 and the sidewall film 30_2 and between the sidewall film 30_3 and the sidewall film 30_4, but not in the space region SP.

Figure 4A:
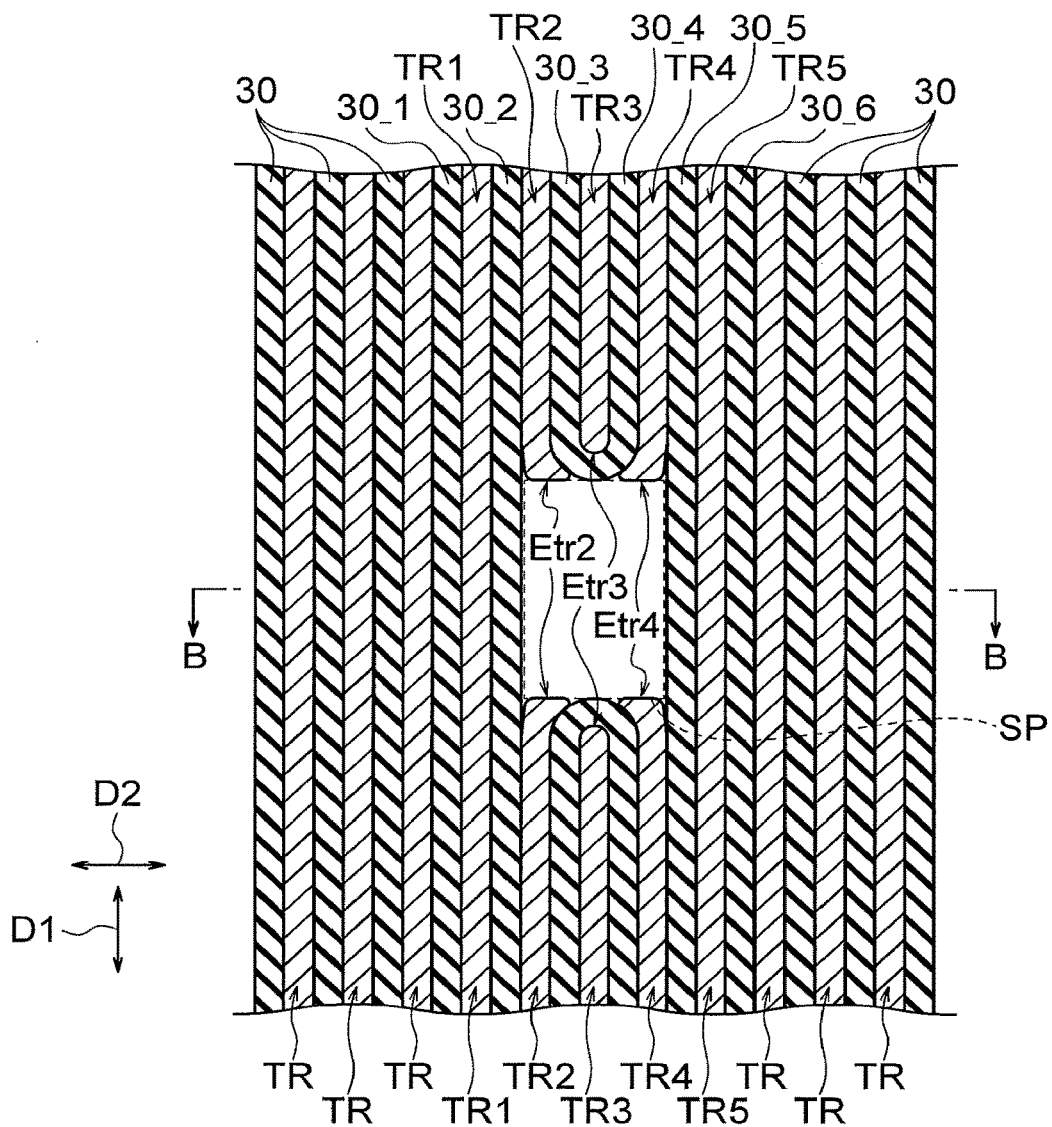
Figure 4B:
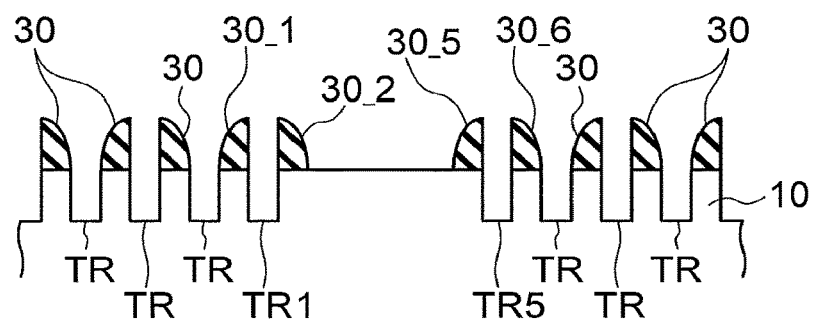

A first groove pattern element TR1 shown in FIG. 4A is formed in the object film 10 using, as masks, the sidewall films 30_1 and 30_2 disposed on both the sides of the first line pattern element 20_1 shown in FIG. 2B. A second groove pattern element TR2 is formed in the object film 10 using, as masks, the sidewall films 30_2 and 30_3 disposed between the first line pattern element 20_1 and the second line pattern element 20_2. A third groove pattern element TR3 is formed in the object film 10 using, as masks, the sidewall films 30_3 and 30_4 on disposed on both the sides of the second line pattern element 20_2. A fourth groove pattern element TR4 is formed in the object film 10 using, as masks, the sidewall films 30_4 and 30_5 disposed between the second line pattern element 20_2 and the third line pattern element 20_3. A fifth groove pattern element TR5 is formed in the object film 10 using, as masks, the sidewall films 30_5 and 30_6 disposed on both the sides of the third line pattern element 20_3.

As shown in FIG. 4A, the second groove pattern element TR2 and the fourth groove pattern element TR4 are not connected to each other, because no groove element is formed where the space region SP is present. Therefore, the object film 10 is not substantially etched in the space region SR Therefore, second groove pattern element TR2 and the fourth groove pattern element TR4 are disconnected from each other.

Due to the presence of the space region SP, the first groove pattern element TR1 projects (extends) further from an end portion Etr2 of the second groove pattern element TR2 in the direction D1, and the end portion Etr2 of the second groove pattern element TR2 is adjacent to the first groove pattern element TR1 in the direction D2. Similarly, the fifth groove pattern element TR5 projects (extends) further from an end portion Etr4 of the fourth groove pattern element TR4 in the direction D1, and the end portion Etr4 of the fourth groove pattern element TR4 is adjacent to the fifth groove pattern element TR5 in the direction D2.

Furthermore, as shown in FIG. 4A, in the layout in the plan view, the end portion Etr2 of the second groove pattern element TR2 projects further in the direction D1 from an end portion Etr3 of the third groove pattern element TR3 toward the space region SP, and also curves toward the third groove pattern element TR3. In the layout in the plan view, the width of the end portion Etr2 increases toward its edge portion. Similarly, in the layout in the plan view, the end portion Etr4 of the fourth groove pattern element TR4 projects further in the direction D1 from the end portion Etr3 of the third groove pattern element TR3 toward the space region SP, and curves toward the third groove pattern element TR3. In the layout in the plan view, the width of the end portion Etr4 increases toward its edge portion. The second and fourth groove pattern elements TR2 and TR4 are widened at their end portions, and curve there toward the third groove pattern element TR3 disposed therebetween. However, the second to fourth groove pattern elements TR2 to TR4 are electrically isolated from one another.

Figure 5A:
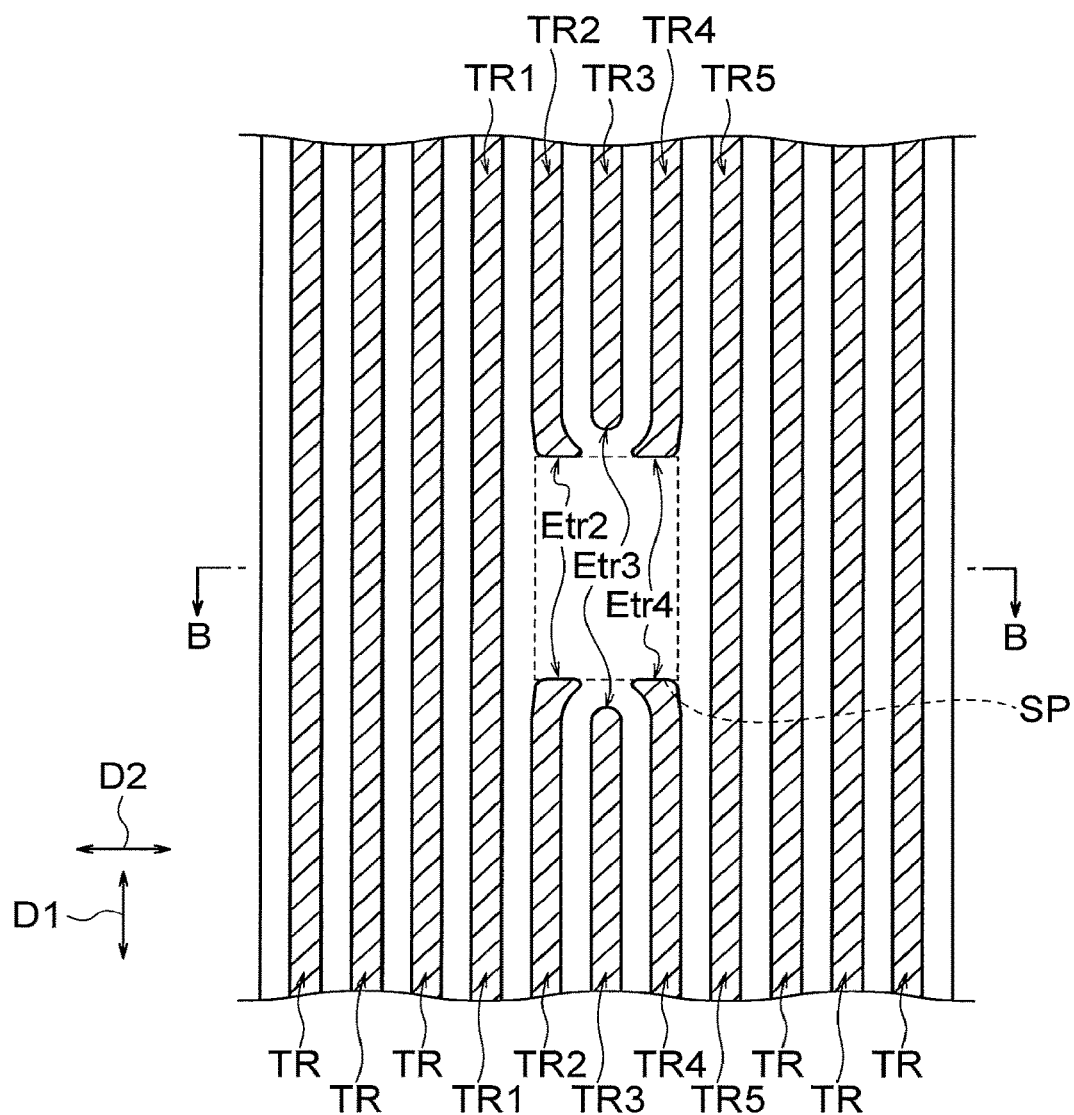
Figure 5B:
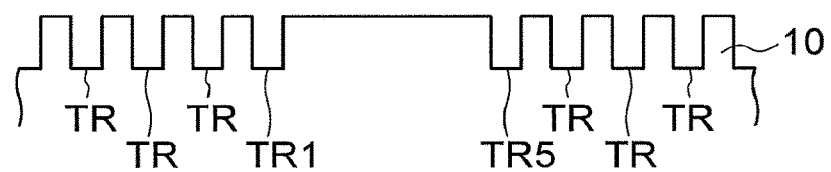

Thereafter, the sidewall films 30 are removed. The removal leaves the groove pattern elements TR on the surface of the object film 10, as shown in FIGS. 5A and 5B.

Figure 6A:
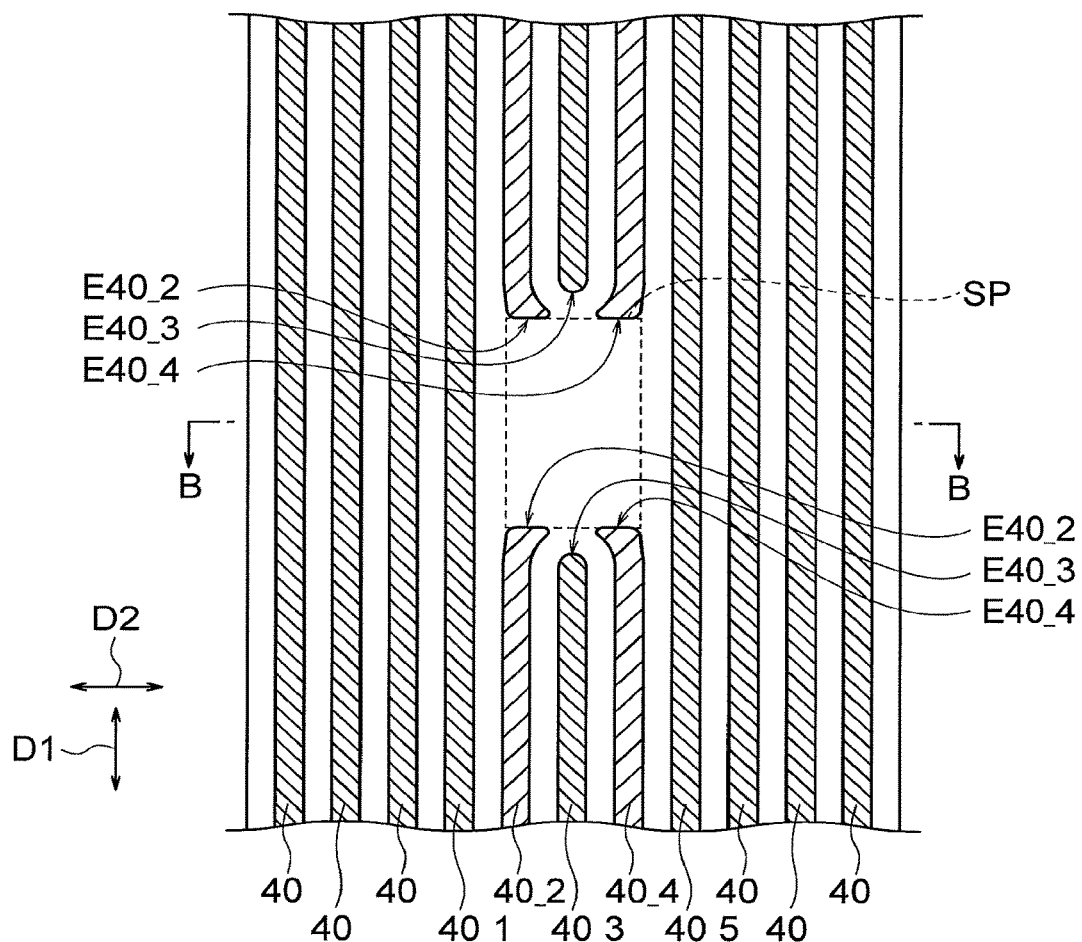
Figure 6B:
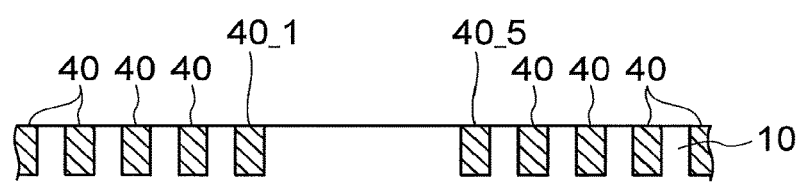

Subsequently, a wiring material is deposited on the object film 10, and polished until the surface of the object film 10 is exposed. The wiring material is, for example, a conductive material such as copper, aluminum, and tungsten. As a result, wiring lines 40 are filled into the groove pattern elements TR, as shown in FIGS. 6A and 6B. Wiring lines 40_1 to 40_5 are filled into the first to fifth groove pattern elements TR1 to TR5, respectively. The wiring lines 40 are formed in the groove pattern elements TR by a damascene process. Accordingly, the wiring lines 40_1 to 40_5 are in the same layout pattern as the first to fifth groove pattern elements TR1 to TR5.

The wiring line 40_1, first wiring line, projects further from an end portion E40_2 of the wiring line 40_2 in the direction D1. The end portion E40_2 of the wiring line 40_2, second wiring line, projects further from an end portion E40_3 of the wiring line 40_3, third wiring line, in the direction D1 toward the space region SP, and curves toward the wiring line 40_3. In the layout in the plan view, the width of the end portion E40_2 increases toward its edge portion. Similarly, an end portion E40_4 of the wiring line 40_4 projects further from the end portion E40_3 of the wiring line 40_3 in the direction D1 toward the space region SP, and curves toward the wiring line 40_3. In the layout in the plan view, the width of the end portion E40_4 increases toward its edge portion. The wiring lines 40_2 and 40_4 are widened at their end portions, and curve toward the wiring line 40_3 disposed therebetween. However, the wiring lines 40_2 to 40_4 are electrically isolated from one another.

Thereafter, such elements as interlayer insulating films, contact plugs, and wiring layers are formed to complete the semiconductor device according to the first embodiment.

According to the first embodiment employing the sidewall transfer method, the pitch of the wiring lines 40 may be smaller than the minimum feature size in lithography. Furthermore, according to the first embodiment, a minute wiring line pattern that is smaller than the minimum feature size in lithography may be formed after the core members 20 are formed without using the lithographic technique by employing the inverse loading effect in the sidewall transfer method. For example, even if the sidewall films 30 are formed to have a loop pattern, the elements in the wiring line pattern, like the second to fourth groove pattern elements TR2 to TR4 and the second to fourth wiring lines 40_2 and 40_4, may be electrically isolated from one another by employing the inverse loading effect, without using the lithographic technique. Since the lithographic technique is not used in forming the second to fourth groove pattern elements TR2 to TR4 and the second to fourth wiring lines 40_2 to 40_4, the size of the space region SP may be made as small as possible without taking into account the margin in the mask pattern during the lithographic process.

(Second Embodiment)

FIGS. 7 to 12 are plan views illustrating a semiconductor device manufacturing method according to a second embodiment. The manufacturing method of the second embodiment is basically the same as that of the first embodiment, although the layout in the plan views of the second embodiment differs from that of the first embodiment. Therefore, no sectional view of the second embodiment is provided.

Figure 7:
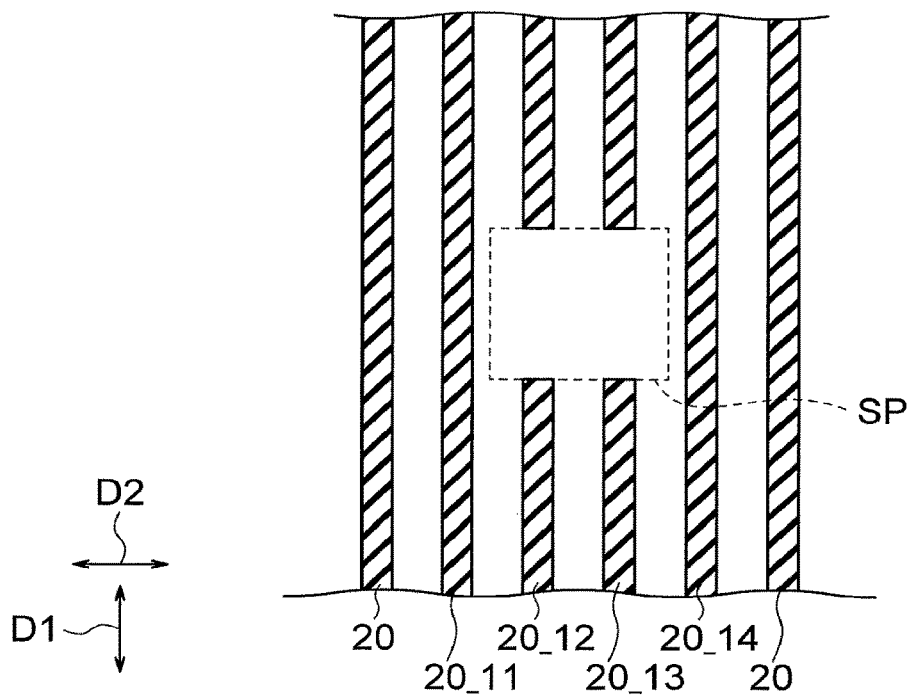
FIGS. 7 to 12 are plan views illustrating a semiconductor device manufacturing method according to a second embodiment.

In the first embodiment, a part of a single core member 20 (20_2) is not present, and the space region SP is present in that part of the core member (20_2). In contrast, a part of two adjacent core members (20_12 and 20_13) is not present in the second embodiment, as shown in FIG. 7. Accordingly, the space region SP is present over the two core members (20_12 and 20_13), and wider in the direction D2. The other parts in the layout in the plan views of the second embodiment are the same as those of the first embodiment.

First, a material of core members 20, a first material, is deposited disposed on an object film 10 to be processed. The material of core members 20 is processed using a photolithographic technique. As a result, the core members 20, which are in a line pattern extending in the first direction D1, are formed as shown in FIG. 7. Among line pattern elements in the line pattern, first to third line pattern elements 20_11 to 20_14, are disposed to be adjacent to one another in the second direction D2. The second line pattern elements 20_12 and 20_13 are not present in portions (partially) between the first line pattern element 20_11 and the third line pattern element 20_14, and a space region SP is present over these portions.

Figure 8:
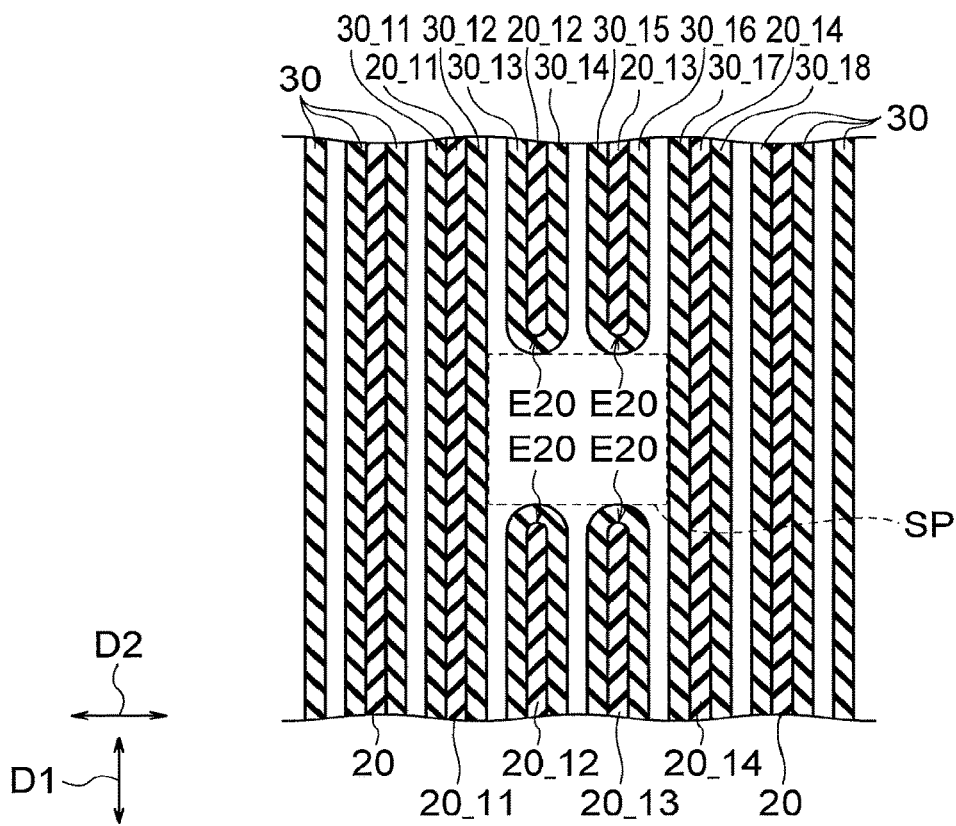

The side surfaces of the core members 20 are slimmed, then a material of sidewall films 30 is deposited on the top surfaces and the side surfaces of the slimmed core members 20, and then etching back of the material of the sidewall films 30 is performed. As a result, the sidewall films 30 are left on the side surfaces of the core members 20 as shown in FIG. 8. The sidewall films 30 at an end portion E20 of the second line pattern element 20_2 form a loop pattern or U-shape pattern to surround the end portion E20. The sidewall films at both sides of the first line pattern element 20_11 are denoted by 30_11 and 30_12, the sidewall films at both sides of the second line pattern element 20_12 are denoted by 30_13 and 30_14, the sidewall films at both sides of the second line pattern element 20_13 are denoted by 30_15 and 30_16, and the sidewall films at both sides of the third line pattern element 20_14 are denoted by 30_17 and 30_18.

Figure 9:
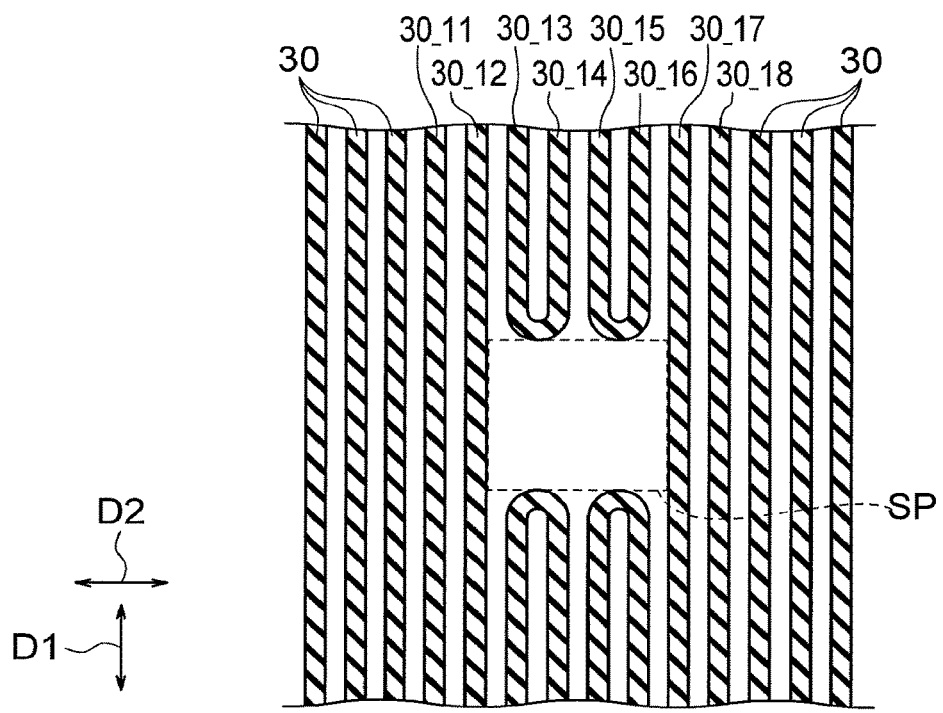

Thereafter, the core members 20 are selectively removed. As a result, the sidewall films 30 are left on the object film 10 as shown in FIG. 9. The sidewall films 30_13 and 30_14, and the sidewall films 30_15 and 30_16 forming a loop pattern or U-shape pattern at the end portions E20 are left in the same shapes.

Figure 10:
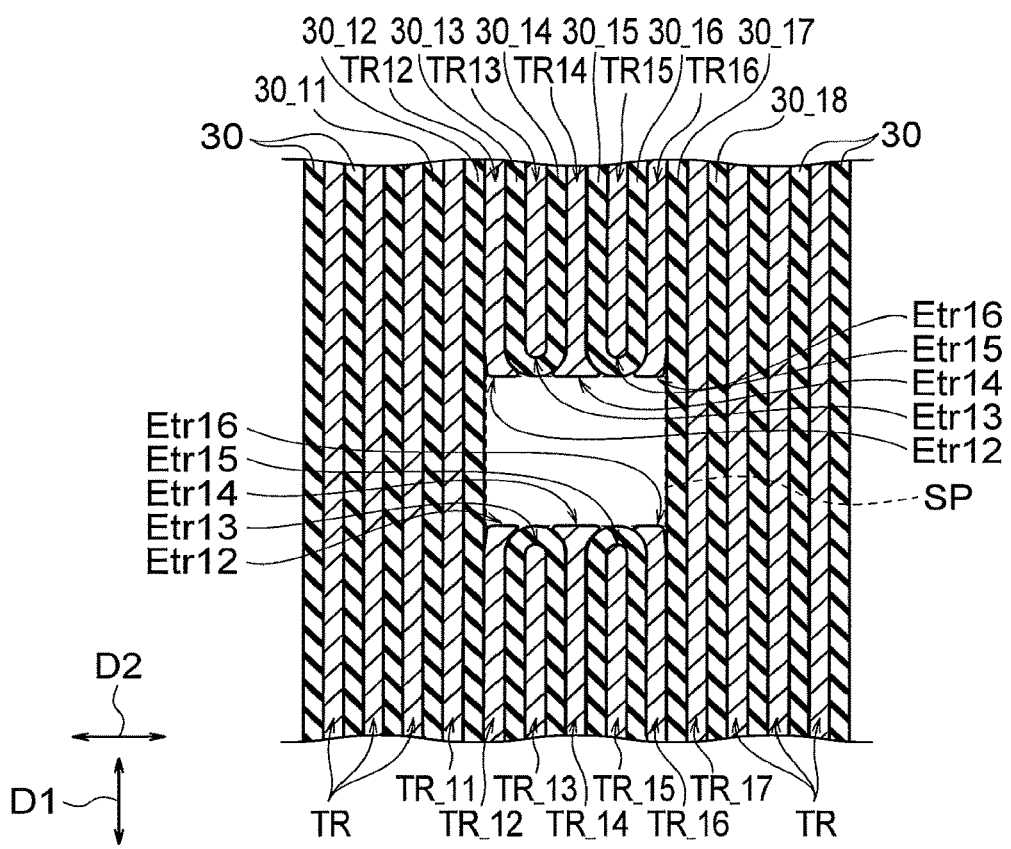

Subsequently, the object film 10 is processed using the sidewall films 30 as masks. The object film 10 is etched in portions exposed between adjacent sidewall films 30, and thus groove pattern elements TR are formed as shown in FIG. 10. An etching technique employing the inverse loading effect is used in etching the object film 10. The object film 10 is etched relatively deeply in relatively narrow regions between the sidewall film 30_11 and 30_18, and is not etched deeply in the space region SP which is relatively wide. Therefore, the groove pattern elements TR are formed in the regions between the sidewall films 30, but not formed in the space region SP. For example, a groove pattern element TR11 is formed between the sidewall films 30_11 and 30_12, a groove pattern element TR12 is formed between the sidewall films 30_12 and 30_13, a groove pattern element TR13 is formed between the sidewall films 30_13 and 30_14, a groove pattern element TR14 is formed between the sidewall films 30_14 and 30_15, a groove pattern element TR15 is formed between the sidewall films 30_15 and 30_16, a groove pattern element TR16 is formed between the sidewall films 30_16 and 30_17, and a groove pattern element TR17 is formed between the sidewall films 30_17 and 30_18.

Since the space region SP is present as shown in FIG. 10, no groove is formed to connect the groove pattern elements TR12, TR14, and TR16, and the object film 10 is left in this portion. Therefore, the groove pattern elements TR12, TR14, and TR16 are electrically isolated from one another.

Due to the presence of the space region SP, the groove pattern element TR11 projects further from an end portion Etr12 of the groove pattern element TR12 in the direction D1, and the end portion Etr12 of the groove pattern element TR12 is adjacent to a side surface of the groove pattern element TR11 in the direction D2. Similarly, the groove pattern element TR17 projects further from an end portion Etr16 of the groove pattern element TR16 in the direction D1, and the end portion Etr16 of the groove pattern element TR16 is adjacent to a side surface of the groove pattern element TR17 in the direction D2.

When comparing the groove pattern element TR12 with the groove pattern element TR13, the groove pattern element TR12 is longer than the groove pattern element TR13 in the direction D1, and projects toward the space region SR Similarly, when comparing the groove pattern element TR16 with the groove pattern element TR15, the groove pattern element TR16 is longer than the groove pattern element TR15 in the direction D1, and projects toward the space region SR When comparing the groove pattern element TR13 with the groove pattern element TR14, the groove pattern element TR14 is longer than the groove pattern element TR13 in the direction Dl, and projects toward the space region SP. When comparing the groove pattern element TR14 with the groove pattern element TR15, the groove pattern element TR14 is also longer than the groove pattern element TR15 in the direction D1, and projects toward the space region SR Thus, in the layout in the plan view, the groove pattern elements TR12 to TR16 alternately (intermittently) project and are formed in a concave-convex manner in the vicinity of the space region SR That is, the groove pattern elements TR12 to TR16 are not aligned with one another.

The end portion Etr12 of the groove pattern element TR12 projects further from the end portion Etr13 of the groove pattern element TR13, and curves toward the groove pattern element TR13. In the layout in the plan view, the width of the end portion Etr12 increases toward its edge portion. Similarly, the end portion Etr16 of the groove pattern element TR16 projects further from the end portion Etr15 of the groove pattern element TR15, and curves toward the groove pattern element TR15. In the layout in the plan view, the width of the end portion Etr16 increases toward its edge portion. Furthermore, the end portion Etr14 of the groove pattern element TR14 projects further from the end portions Etr13 and Etr15 of the groove pattern elements TR13 and TR15, and curves toward both the groove pattern elements TR13 and TR15. In the layout in the plan view, the width of the end portion Etr14 increases toward its edge portion. Although the groove pattern elements TR12, TR14, and TR16 increase in width at their end portions, and curve toward the groove pattern elements TR13 and TR15 disposed among them, the groove pattern elements TR12 to TR16 are electrically isolated from one another.

Figure 11:
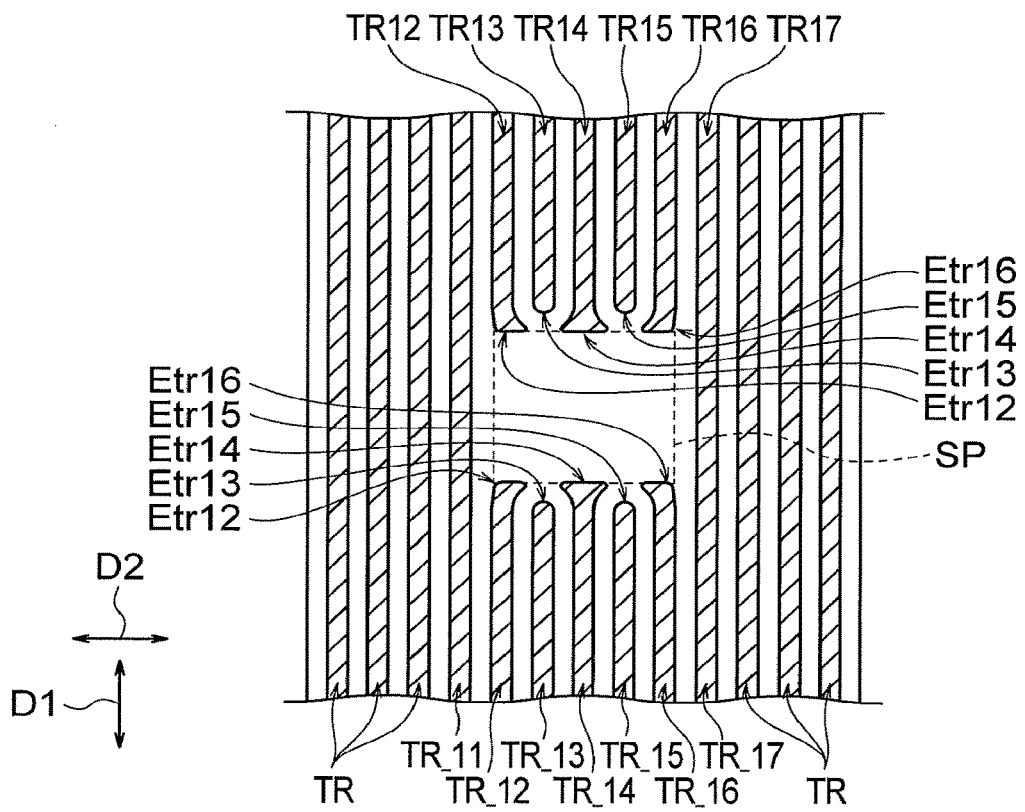

Thereafter, the sidewall films 30 are removed. The removal leaves the groove pattern elements TR in the object film 10, as shown in FIG. 11.

Figure 12:
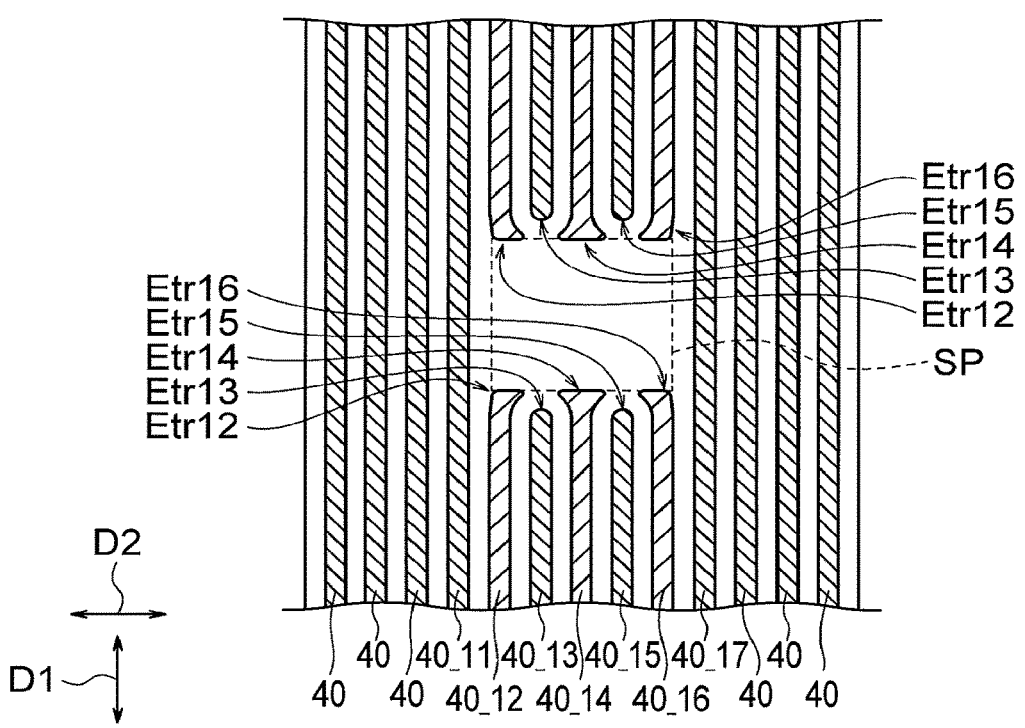

Subsequently, a wiring material is deposited on the object film 10, and polished until the surface of the object film 10 is exposed. As a result, wiring lines 40 are filled into the groove pattern elements TR as shown in FIG. 12. Wiring lines 40_11 to 40_17 are filled into the groove pattern elements TR11 to TR17, respectively. In accordance with the groove pattern elements TR12, TR14, and TR16, the wiring lines 40_12, 40_14, and 40_16 increase in width at their end portions, and curve toward the wiring lines 40_13 and 40_15 disposed among them. However, the wiring lines 40_12, 40_14, and 40_16 are electrically isolated from one another.

The wiring lines 40_12 to 40_16 have the same planar shapes as the groove pattern elements TR12 to TR16. Accordingly, in the layout in the plan view, the wiring lines 40_12 to 40_16 alternately (intermittently) project and are formed in a concave-convex manner in the vicinity of the space region SP. That is, the wiring lines 40_12 to 40_16 are not aligned with one another.

Thereafter, such elements as interlayer insulating films and wiring layers are formed to complete the semiconductor device according to the second embodiment.

As described above, a wider space region SP may be formed by removing portions of a plurality of adjacent core members (20_12 and 20_13). The semiconductor device with the aforementioned layout in the plan view according to the second embodiment may be manufactured in the same method for manufacturing the semiconductor device according to the first embodiment. Therefore, the second embodiment may have the same effect as the first embodiment. The number of core members 20, portions of which are not present in order to have the space region SP, may be three or more.

(Third Embodiment)

Figure 13A:
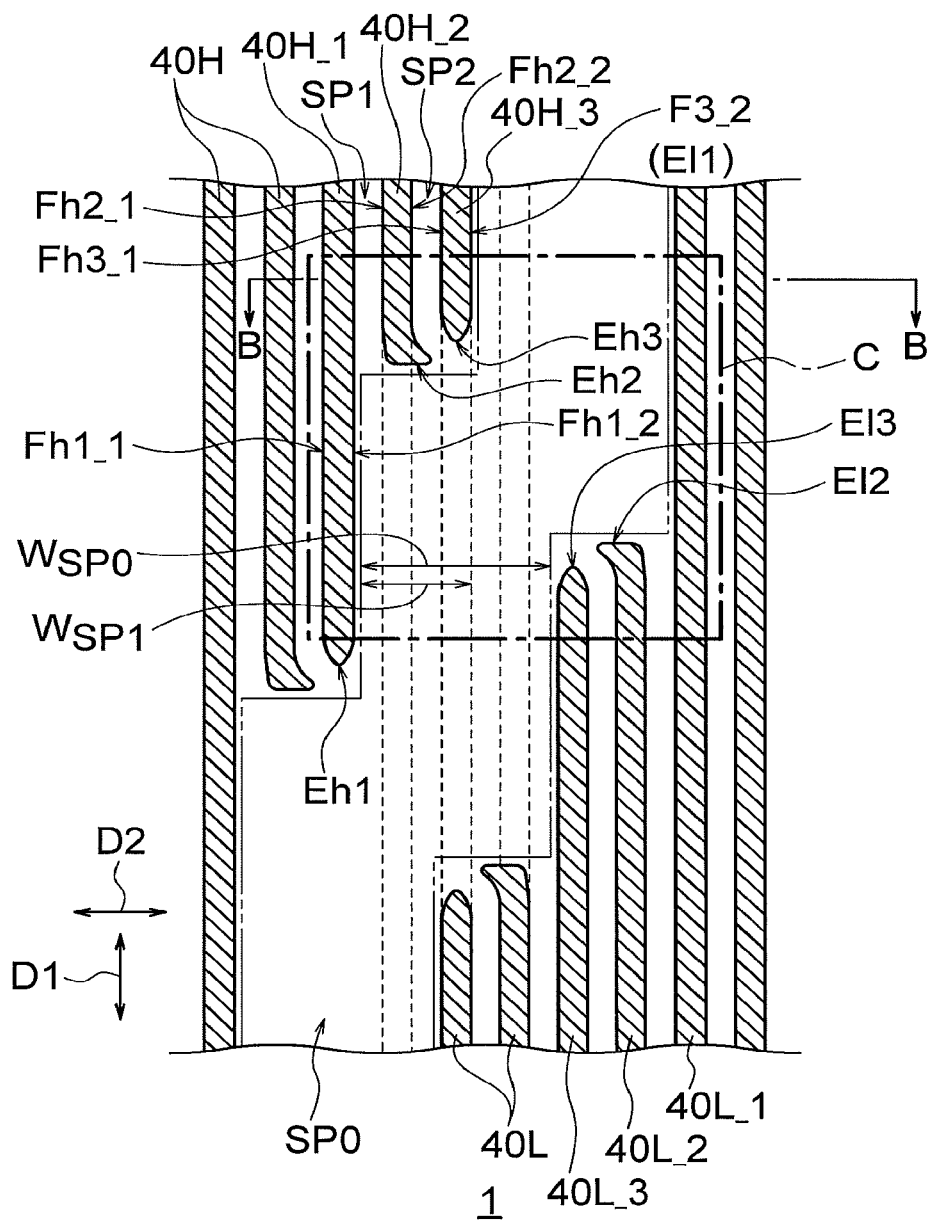
FIGS. 13A to 13C illustrate the layout in plan views and the cross-sectional view of a part of a semiconductor device 1 according to a third embodiment.
Figure 13B:
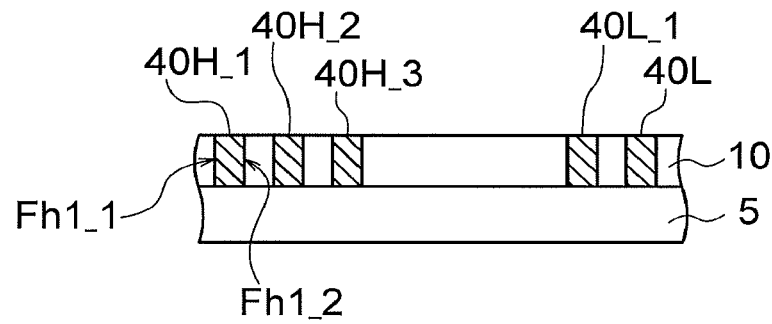
Figure 13C:
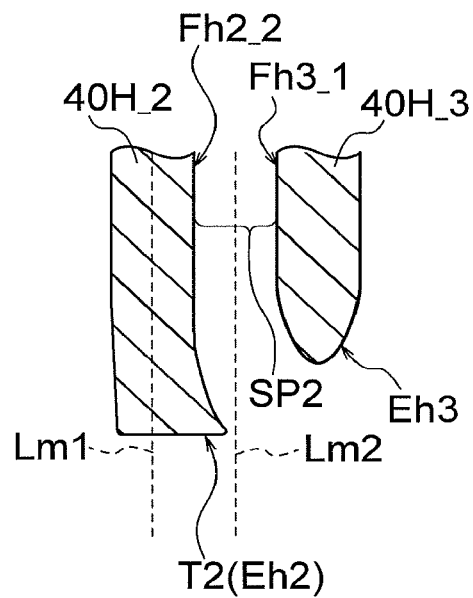

FIGS. 13A to 13C illustrate the layout in plan views and a cross-sectional view of a part of a semiconductor device 1 according to a third embodiment. The semiconductor device 1 may be, for example, a memory device such as a NAND EEPROM (Electrically Erasable Programmable Read-Only Memory). A high voltage may sometimes be applied to bit lines from memory cells in such a memory device. In this case, the high voltage applied to the bit lines should be converted to a low voltage in order to detect data at a sense amplifier. For the voltage conversion, a bit line on the memory cell side, to which a high voltage is applied, is connected to a bit line on the sense amplifier side, to which a low voltage is applied, via a transistor. Since the interval ("pitch") in the line and space pattern of the bit lines is made less than the minimum feature size in lithography by the sidewall transfer method, the size of the transistor is greater than the pitch of bit lines. Therefore, if, in order to separate the bit lines to those on the memory cell side and those on the sense amplifier side, each bit line is simply cut in a direction (the direction D2 in FIG. 13) perpendicular to the direction along which each bit line extends, it is difficult to connect the bit lines to corresponding transistors.

Since the pitch of the bit lines is less than the minimum feature size in lithography, it is difficult to change the cut position for each bit line using the lithographic technique. Furthermore, if a high-voltage bit line and a low-voltage bit line are located close to each other, the breakdown voltage between these bit lines may be lowered.

The bit lines may be formed by cutting a loop pattern in a sidewall pattern made in a sidewall transfer method (loop cut) using the lithographic technique. However, in this case, the size of the loop pattern is less than the minimum feature size in photolithography. Therefore, it is difficult to expose a mask pattern in accordance with the loop pattern. On the other hand, if a margin is given to the loop pattern so that the mask pattern may be processed using a lithographic technique, the area penalty in this portion may increase, as described above.

Therefore, in the third embodiment, a loop cut process is performed without using the lithographic technique but using the first embodiment or the second embodiment, which employs the inverse loading effect.

The structure of the semiconductor device 1 according to the third embodiment will be described with reference to FIGS. 13A to 13C. The semiconductor device 1 includes a base layer 5, an object film 10, and wiring lines 40H and 40L. The base layer 5, first layer, may be an interlayer dielectric film and the like disposed on a semiconductor substrate (not shown). Semiconductor devices such as transistors (not shown) are disposed on the semiconductor substrate, and the base layer 5, as the interlayer dielectric film, covers upper portions of the semiconductor devices. The object film 10 is, for example, an insulating film of silicon oxide, and disposed on the base layer 5.

The wiring lines 40H and 40L are formed in the object film 10. For example, a high voltage is applied to the wiring lines 40H, and a low voltage is applied to the wiring lines 40L. The wiring lines 40H and 40L may be formed of a conductive metal such as copper, aluminum, tungsten and the like. It is needed that the distance between the wiring lines 40H and the wiring lines 40L be more than a predefined distance in order to maintain the breakdown voltage. On the other hand, for the miniaturization of the semiconductor device 1, the distance between the wiring lines 40H and the wiring lines 40L should not be larger than necessary. In consideration of the above matters, the distance between the wiring lines 40H and the wiring lines 40L is appropriately set so that the object film 10 is left between the wiring lines 40H and the wiring lines 40L by using the inverse loading effect. Hereinafter, the wiring lines 40H, to which a high voltage is applied, will be described.

The wiring lines 40H include a first wiring line 40H_1, a second wiring line 40H_2, and a third wiring line 40H_3, which are enclosed by a broken line in an area C in FIG. 13A. The first to third wiring lines 40H_1 to 40H_3 extend in a direction D1 and arranged in a direction D2 on the base layer 5.

A side surface Fh1_2 of the first wiring line 40H_1 faces a side surface Fh2_1 of the second wiring line 40H_2. An end portion Eh1 of the first wiring line 40H_1 projects further from an end portion Eh2 of the second wiring line 40H_2 in the direction D1. Therefore, the side surface Fh2_1 of the second wiring line 40H_2 faces the side surface Fh1_2 of the first wiring line 40H_1.

A side surface Fh2_1 of the second wiring line 40H_2 faces the side surface Fh1_2 of the first wiring line 40H_1, and a side surface Fh2_2 of the second wiring line 40H_2 faces a side surface Fh3_1 of the third wiring line 40H_3. The end portion Eh2 of the second wiring line 40H_2 projects further from an end portion Eh3 of the third wiring line 40H_3 in the direction D1, and curves toward the third wiring line 40H_3. In the layout in the plan view, the width of the end portion Eh2 increases toward the edge portion. For example, the side surface Fh2_1 of the second wiring line 40H_2 does not curve very much toward the third wiring line 40H_3 at the end portion Eh2. The side surface Fh2_2 curves toward the third wiring line 40H_3 more than the side surface Fh2_1 at the end portion Eh2.

A side surface Fh3_1 of the third wiring line 40H_3 faces the side surface Fh2_2 of the second wiring line 40H_2, and a side surface Fh3_2 of the third wiring line 40H_3 faces a space region SP0. The end portion Eh3 of the third wiring line 40H_3 does not curve like the end portion Eh2 of the second wiring line 40H_2, and has a substantially linear and tapered shape. Thus, the end portion Eh2 of the second wiring line 40H_2 curves (bows) more toward one side than the end portion Eh3 of the third wiring line 40H_3.

As shown in FIG. 13C, a tip portion T2 of the end portion Eh2 is located between an intermediate line Lm1 extending substantially along a center line of the second wiring line 40H_2, and an intermediate line Lm2 extending substantially along a center line of a second space pattern area SP2. The second space pattern area SP2 is located between the second wiring line 40H_2 and the third wiring line 40H_3.

As will be describe later, the second and third wiring lines 40H_2 and 40H_3 are formed by a loop cut process using the inverse loading effect. Therefore, the second and third wiring lines 40H_2 and 40H_3 form a pair (wiring line pair). The pair of the second and third wiring lines 40H_2 and 40H_3 is adjacent to the first wiring line 40H_1 on the second wiring line 40H_2 side, and faces the space region SP0 on the third wiring line 40H_3 side. Thus, after the loop cut process using the inverse loading effect, the second and third wiring lines 40H_2 and 40H_3 are separated from each other in the space region SP0. The end portion Eh2 of the second wiring line 40H_2 projects further from the end portion Eh3 of the third wiring line 40H_3 in the direction D1, and curves toward the end portion Eh3. In the layout in the plan view, the width of the end portion Eh2 increases toward the edge portion.

A portion of the side surface Fh1_2 of the first wiring line 40H_1 not facing the second wiring line 40H_2 faces the space region SP0. Thus, the side surface Fh1_2 faces the space region SP0 in the portion below the end portions Eh2 and Eh3 in FIG. 13A.

The width Wsp0 of the space region SP0 is greater than the sum Wspl of the width of a first space pattern area SP1 between the first wiring line 40H_1 and the second wiring line 40H_2, the line width of the second wiring line 40H_2, the width of the second space pattern area SP2 between the second wiring line 40H_2 and the third wiring line 40H_3, and the line width of the third wiring line 40H_3. In other words, the width Wsp0 of the space region SP0 is greater than the width Wsp1, which corresponds to two times the pitch of the wiring lines 40.

The pitch of the wiring lines 40 is, for example, less than about 40 nm, which is less than the resolution limit width in lithography. In this case, the sum of the width of the first space pattern area SP1 between the first wiring line 40H_1 and the second wiring line 40H_2, and the line width of the second wiring line 40H_2 is less than about 40 nm. The sum of the width of the second space pattern area SP2 between the second wiring line 40H_2 and the third wiring line 40H_3 and the line width of the third wiring line 40H_3 is also less than about 40 nm. The width Wsp0 of the space region SP0 is more than about 80 nm (Wsp1). In this case, if the boundary (threshold value) in space width to cause the inverse loading effect is within the range from about 20 nm to about 80 nm, the object film 10 may be left in the space region SPO using the inverse loading effect.

The wiring lines 40L to which a low voltage is applied may be formed in the same manner as the wiring lines 40H to which a high voltage is applied. For example, the wiring lines 40L_1 to 40L_3 may correspond to the first to third wiring lines in the foregoing descriptions. Therefore, the descriptions are omitted for the wiring lines 40L to which a low voltage is applied.

FIGS. 14A to 17B are plan views and cross-sectional views illustrating a semiconductor device manufacturing method according to the third embodiment. FIGS. 14A, 15A, 16A, and 17A are plan views, and FIGS. 14B, 15B, 16B, and 17B are cross-sectional views. FIGS. 14B, 15B, 16B, and 17B illustrate cross sections taken along lines B-B in FIGS. 14A, 15A, 16A, and 17A, respectively. FIGS. 14A to 17B show the area corresponding to the area C surrounded by the broken line in FIG. 13A. Although the third embodiment differs from the first embodiment in the layout in the plan view, the manufacturing method for the third embodiment is basically the same as that for the first embodiment.

Figure 14A:
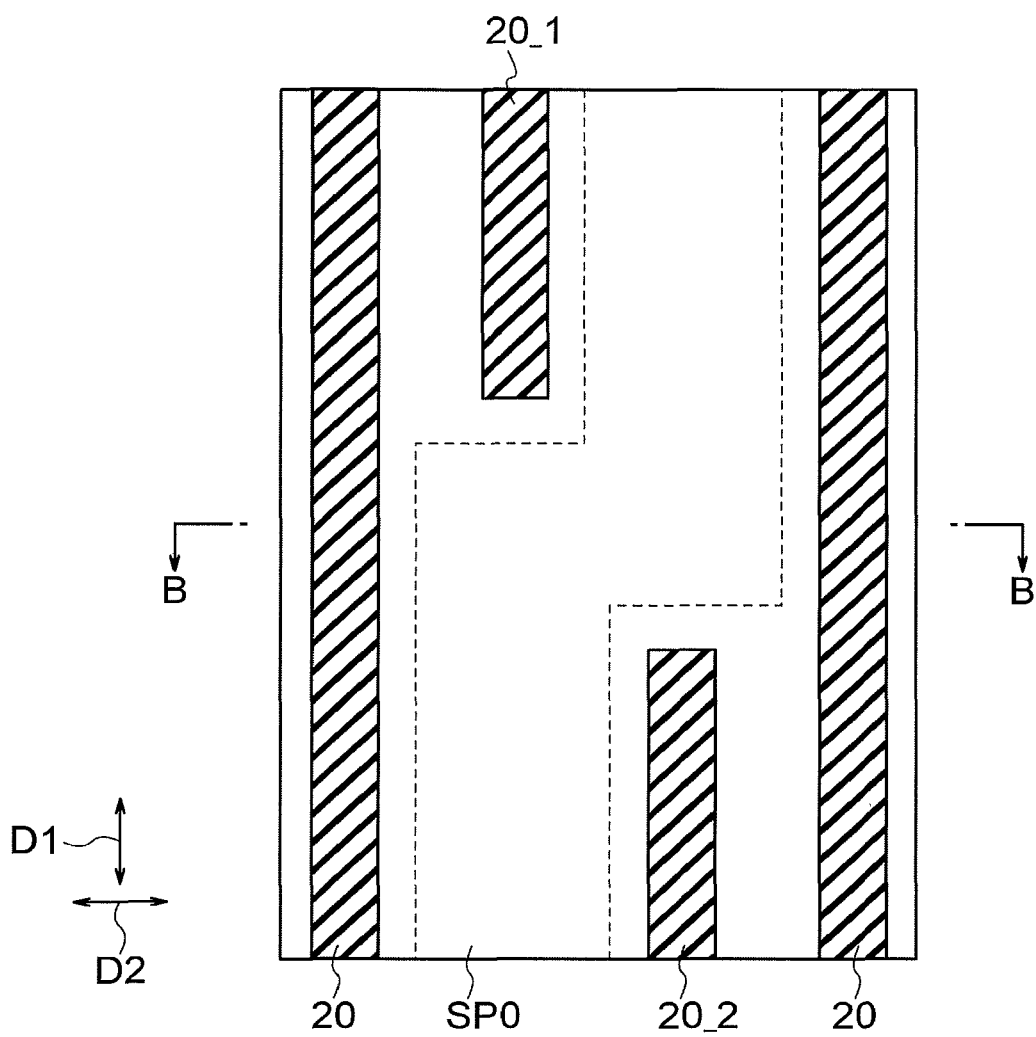
FIGS. 14A to 17B are plan views and cross-sectional views illustrating a semiconductor device manufacturing method according to the third embodiment.
Figure 14B:
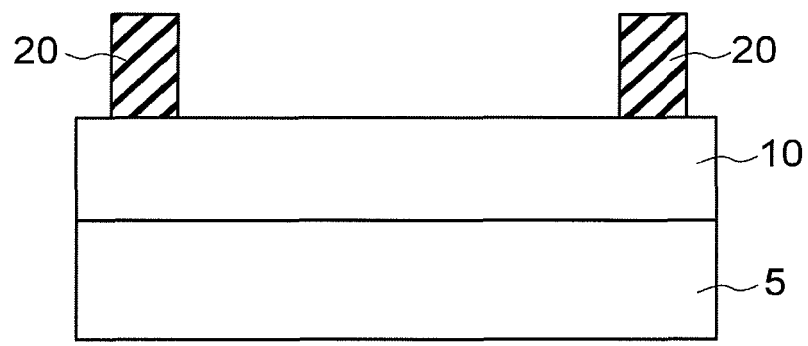

First, a material of core members 20 is deposited on an object film 10 to be processed. The material of core members 20 is processed using a photolithographic technique. As a result, the core members 20 are processed to become wiring lines extending in a direction D1 as shown in FIGS. 14A and 14B. A portion is not present in each of the core members 20_1 and 20_2, and a space region SPO is present in this portion.

Thereafter, the core members 20 are slimmed, then a material of sidewall films 30 is deposited on top surfaces and side surfaces of the core members 20, and etching back of the material of the sidewall films 30 is performed. As a result, sidewall films 30 are left on the side surfaces of the core members 20. At end portions E20 of the core members 20_1 and 20_2, the sidewall films 30 are formed to have a loop shape or U-shape to surround the end portions E20.

Figure 15A:
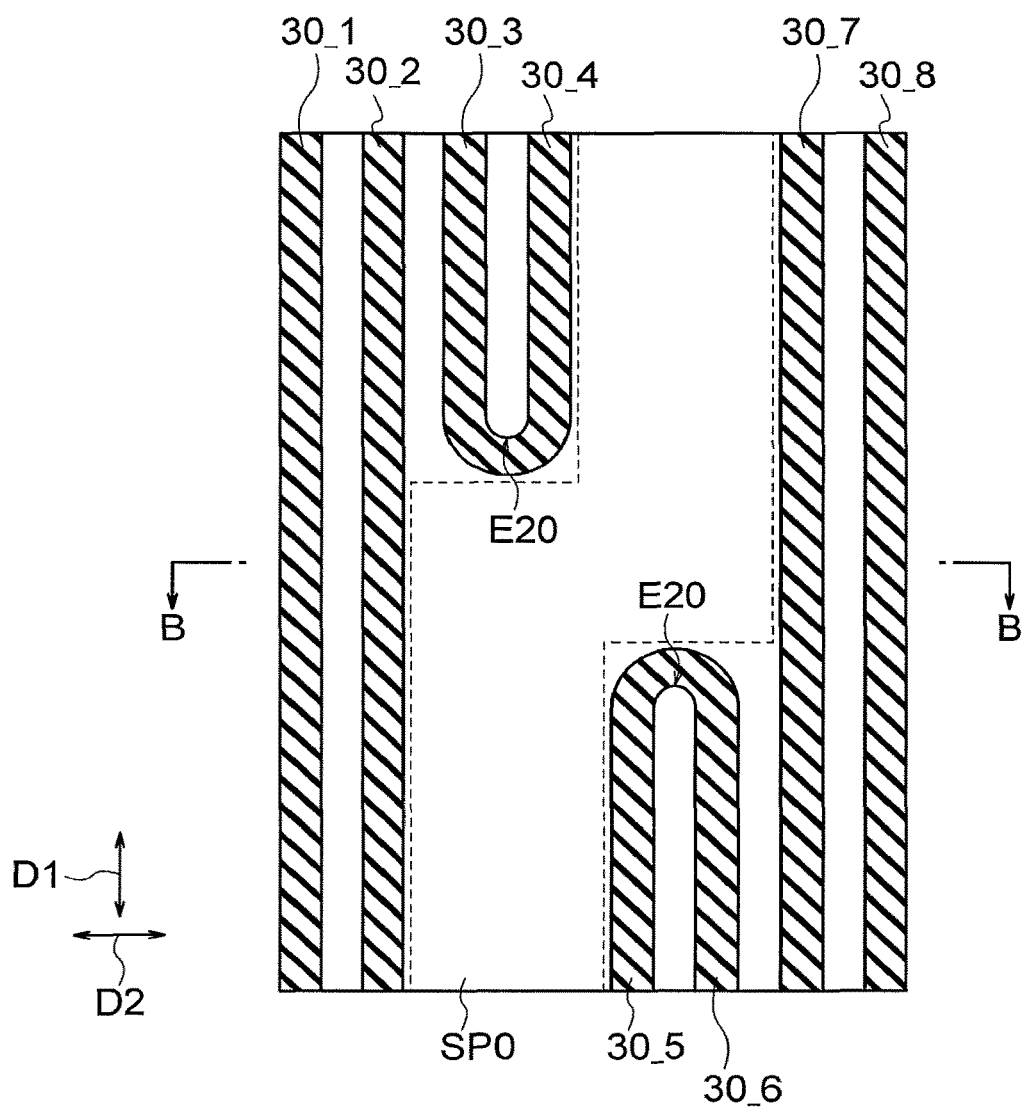
Figure 15B:
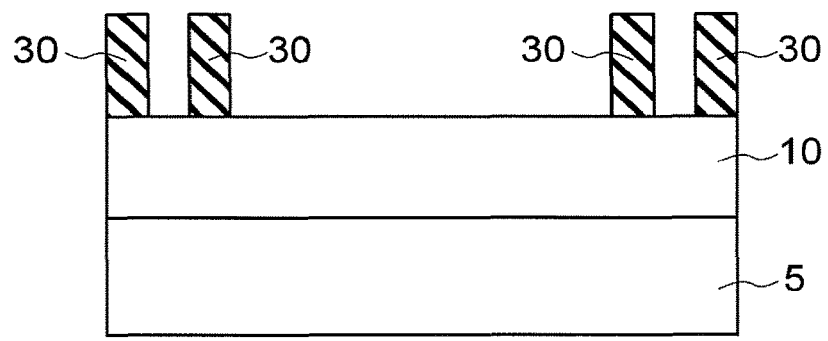
Figure 16A:
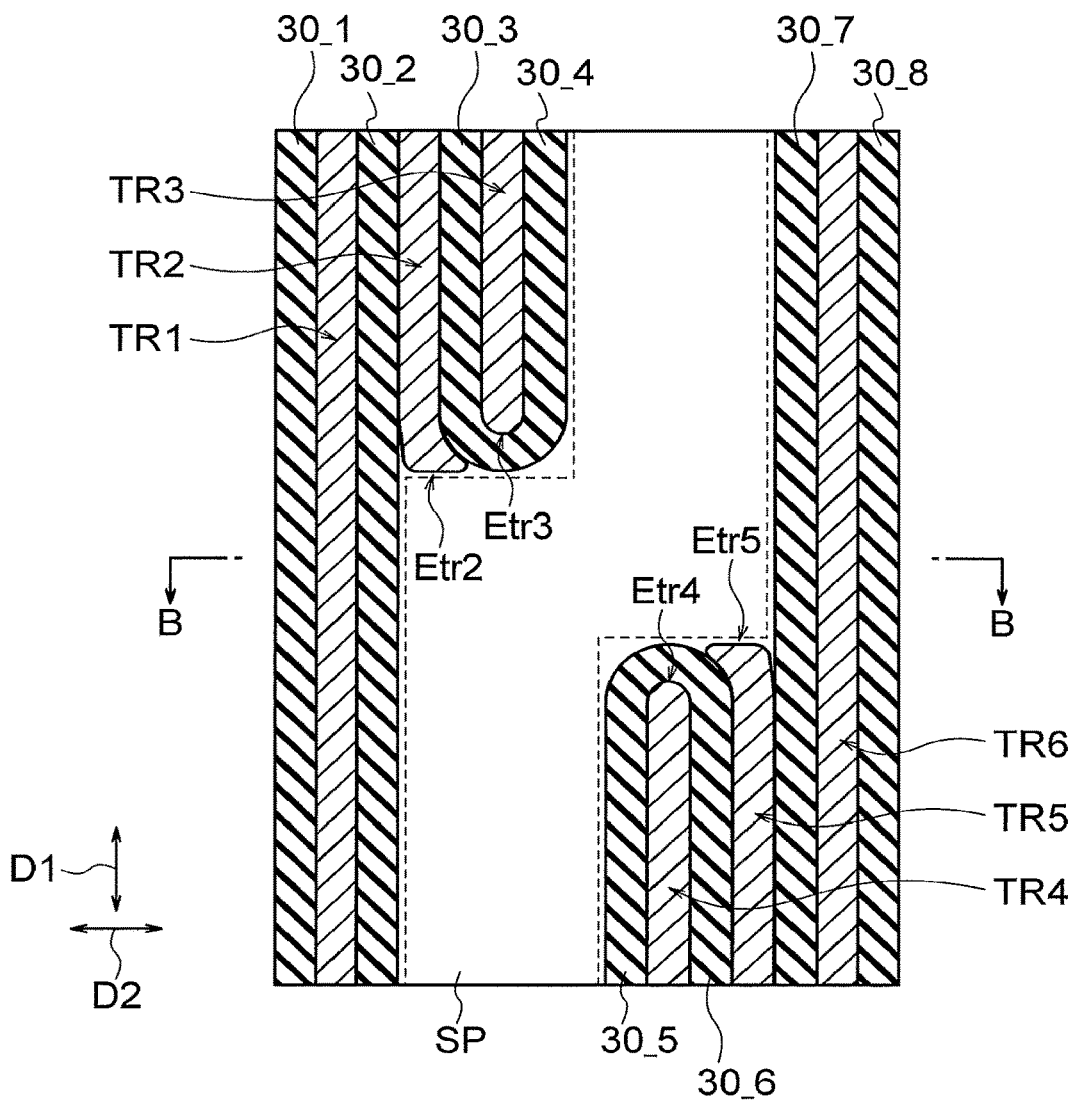
Figure 16B:
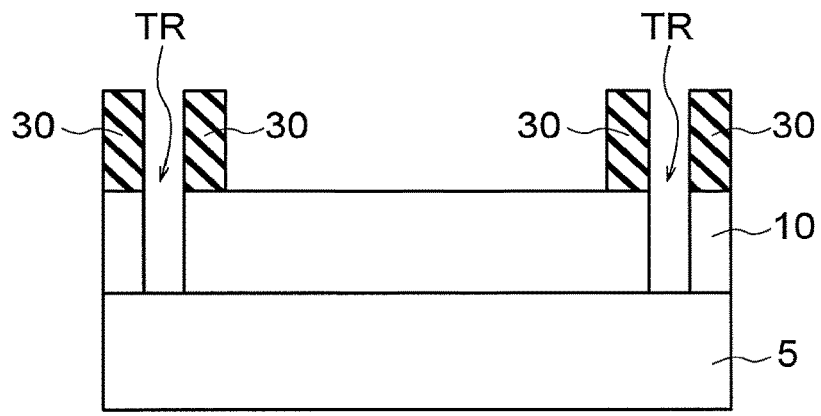

Subsequently, the core members 20 are selectively removed. As a result, the sidewall films 30 are left on the object film 10 as shown in FIGS. 15A and 15B. The sidewall films 30_3 to 30_6 having a loop shape or U-shape are left in the same shape.

Thereafter, the object film 10 is processed using the sidewall films 30 as masks. Portions of the object film 10 exposed between adjacent sidewall films 30 are etched to form groove pattern elements TR. The object film 10 is etched using an etching technique employing the inverse loading effect. As a result, the object film 10 is etched relatively deeply in relatively narrow regions among the sidewall films 30, but not etched much in the space region SPO, which is relatively wide.

Therefore, the groove pattern elements TR are formed among the sidewall films 30, but not formed in the space region SPO. For example, groove pattern elements TR1 to TR6 are formed between the sidewall film 30_1 and the sidewall film 30_2, between the sidewall film 30_2 and the sidewall film 30_3, between the sidewall film 30_3 and the sidewall film 30_4, between the sidewall film 30_5 and the sidewall film 30_6, between the sidewall film 30_6 and the sidewall film 30_7, and between the sidewall film 30_7 and the sidewall film 30_8, respectively. In the space region SPO, the object film 10 is left.

Due to the presence of the space region SPO, the groove pattern element TR1 projects further from an end portion Etr2 of the groove pattern element TR2 in a direction D1, and the end portion Etr2 of the groove pattern element TR2 is adjacent to the groove pattern element TR1 in a direction D2. Similarly, the groove pattern element TR6 projects further from an end portion Etr5 of the groove pattern element TR5 in the direction D1, and the end portion Etr5 of the groove pattern element TR5 is adjacent to the groove pattern element TR6 in the direction D2.

When comparing the groove pattern element TR2 with the groove pattern element TR3, the groove pattern element TR2 projects longer than the groove pattern element TR3 in the direction D1, and curves toward the groove pattern element TR3. In the layout in the plan view, the width of the end portion Etr2 of the groove pattern element TR2 increases toward its edge portion. Similarly, when comparing the groove pattern element TR5 with the groove pattern element TR4, the groove pattern element TR5 projects longer than the groove pattern element TR4 in the direction D1, and curves toward the groove pattern element TR4. In the layout in the plan view, the width of the end portion Etr5 of the groove pattern element TR5 increases toward its edge portion.

Thereafter, the sidewall films 30 are removed. The removal leaves the groove pattern elements TR in the surface of the object film 10.

Figure 17A:
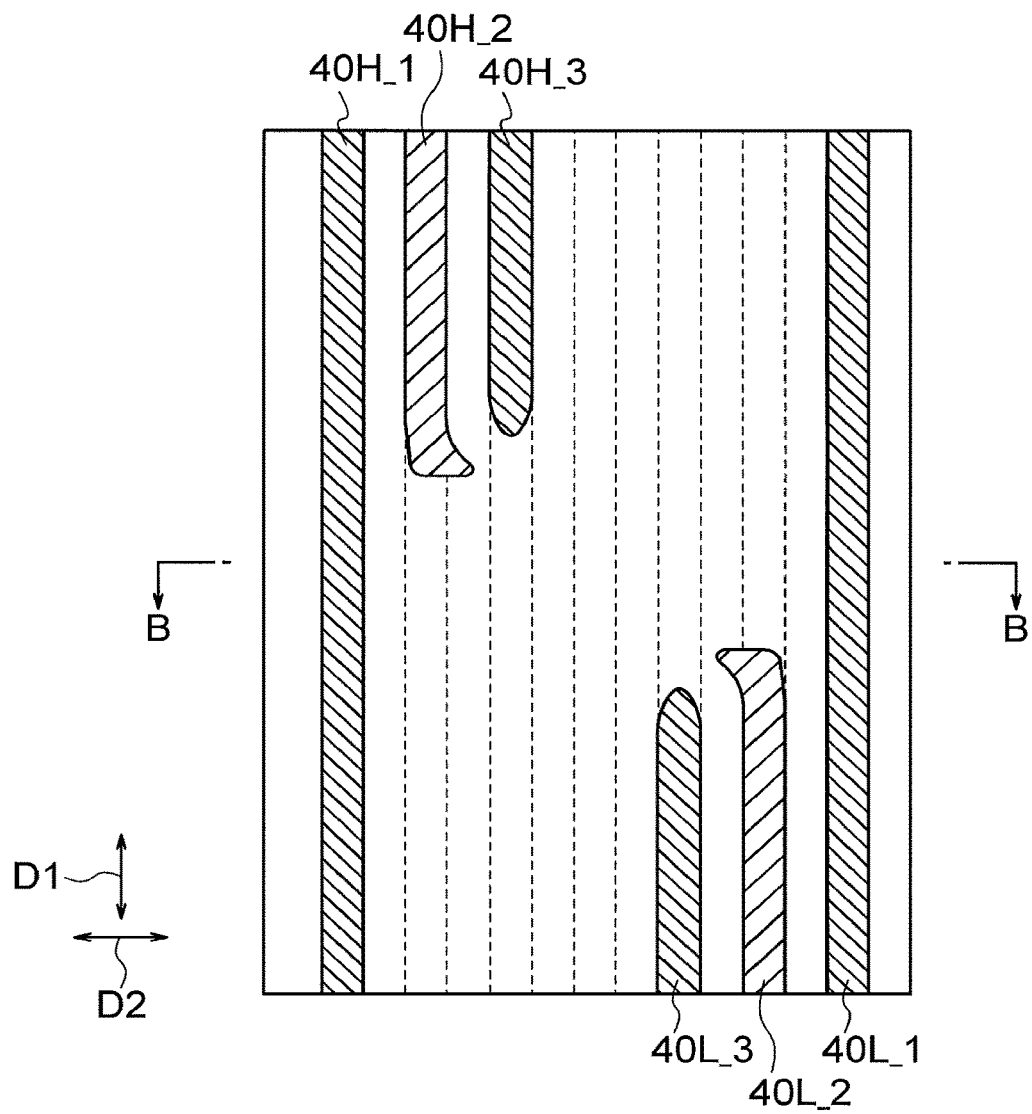
Figure 17B:
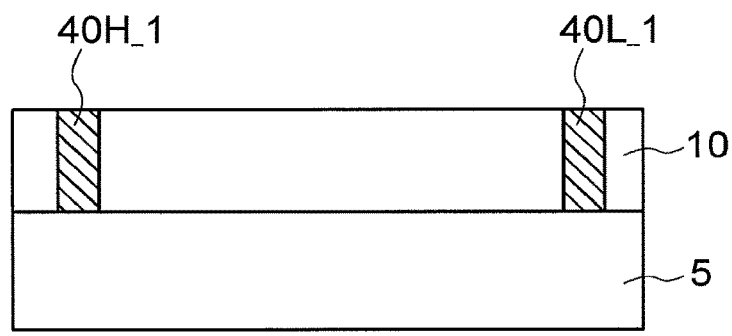

Subsequently, a wiring material is deposited on the object film 10, and polished until the surface of the object film 10 is exposed. As a result, wiring lines 40 are filled into the groove pattern elements TR as shown in FIGS. 17A and 17B. For example, a wiring line 40H_1, a wiring line 40H_2, and a wiring line 40H_3 are filled into the groove pattern element TR1, the groove pattern element TR2, and the groove pattern element TR3, respectively, and a wiring line 40L_1, a wiring line 40L_2, and a wiring line 40L_3 are filled into the groove pattern element TR6, the groove pattern element TR5, and the groove pattern element TR4, respectively. Accordingly, the wiring lines 40H_1 to 40H_3 and 40L_1 to 40L_3 are in the same layout pattern as the groove pattern elements TR1 to TR3 and TR6 to TR4. Although the wiring line 40H_2 increases in width at its edge portion, and curves toward the wiring line 40H_3, the wiring line 40H_2 and the wiring line 40H_3 are electrically isolated from each other. Similarly, although the wiring line 40L_2 increases in width at its edge portion, and curves toward the wiring line 40L_3, the wiring line 40L_2 and the wiring line 40L_3 are electrically isolated from each other.

Thereafter, such elements as interlayer insulating films and wiring layers are formed to complete the semiconductor device according to the third embodiment.

As described above, in the third embodiment, high-voltage bit lines and low-voltage bit lines are processed using the first embodiment or the second embodiment. Therefore, the same effect as may be obtained from the first embodiment or the second embodiment may be obtained from the third embodiment.

In the third embodiment, the groove pattern elements TR are formed not using the lithographic technique but using the inverse loading effect. Since the lithographic technique is not used during the loop cut process, no extra space in consideration of misalignment in the lithographic process is needed. Therefore, the area penalty may be made as small as possible with a certain degree of distance being kept between the high-voltage bit lines and the low-voltage bit lines. Furthermore, since the lithographic technique is not used but the inverse loading effect is used in the loop cut process, the loop cut process may be performed more easily in a shorter time.

If the wiring lines 40 need to be also formed in the space regions SP and SP0 in the first to third embodiments, the object film 10 in the space regions SP and SP0 may be processed using the lithographic technique before the wiring material is filled. The wiring lines 40 may be formed in the space regions SP and SP0 in this manner. The wiring lines 40 in the space regions SP and SP0 may be dummy wiring lines which are not electrically connected to the bit lines.

(Fourth Embodiment)

In the first to third embodiments, a sidewall transfer process is performed only once. In the fourth embodiment, however, the sidewall transfer process is repeatedly performed. In each or any of the sidewall transfer processes, the inverse loading effect may be used.

FIGS. 18A to 19C are cross-sectional views showing a semiconductor device manufacturing method according to the fourth embodiment. In the fourth embodiment, the sidewall transfer process is performed twice. In the second process, the inverse loading effect is used. The layout in the plan view of the fourth embodiment may be the same as that of any of the first to third embodiments.

First, an object film 120 to be processed and a hard mask 130 are sequentially deposited on a base layer 110, as shown in FIG. 18A. The base layer 110 is, for example, a semiconductor substrate or an interlayer insulating film. The object film 120 is an insulating film such as an interlayer dielectric film, and formed of, for example, silicon oxide. The hard mask 130 is, for example, a silicon nitride film or a polycrystalline silicon film.

A material of core members 140 is deposited on the hard mask 130, and processed using a lithographic technique to obtain core members 140. As a result, a cross-sectional structure shown in FIG. 18A is obtained.

Thereafter, the core members 140 are slimmed to decrease their width. A material of sidewall films 150 is deposited on top surfaces and side surfaces of the slimmed core members 140, and etching back of the material of sidewall films 150 is performed. The sidewall films 150 are formed of a material that may be selectively etched with respect to the hard mask 130 and the core members 140, such as silicon nitride and polycrystalline silicon and the like. As a result, the sidewall films 150 are left on the side surfaces of the core members 140 as shown in FIG. 18B.

Subsequently, the core members 140 are selectively removed. As a result, the sidewall films 150 are left on the hard mask 130, as shown in FIG. 18C.

Thereafter, the hard mask 130 is processed using the sidewall films 150 as masks. As a result, the pattern of the sidewall films 150 is transferred to the hard mask 130, as shown in FIG. 18D. During the etching of the hard mask 130, the inverse loading effect is not used, but a common etching technique is used.

Figure 19A:
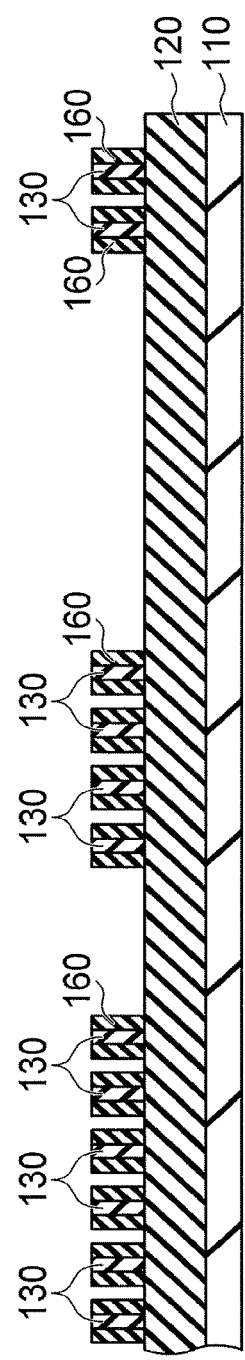

Subsequently, the hard mask 130 is slimmed to decrease their widths. A material of sidewall films 160 is deposited on top surfaces and side surfaces of the slimmed hard mask elements 130, and etching back of the material of sidewall films 160 is performed. The material of sidewall films 160 may be selectively etched with respect to the object film 120 and the hard mask 130, for example silicon nitride or polycrystalline silicon. As a result, the sidewall films 160 are left on the side surfaces of the hard mask elements 130 as shown in FIG. 19A.

Figure 19B:
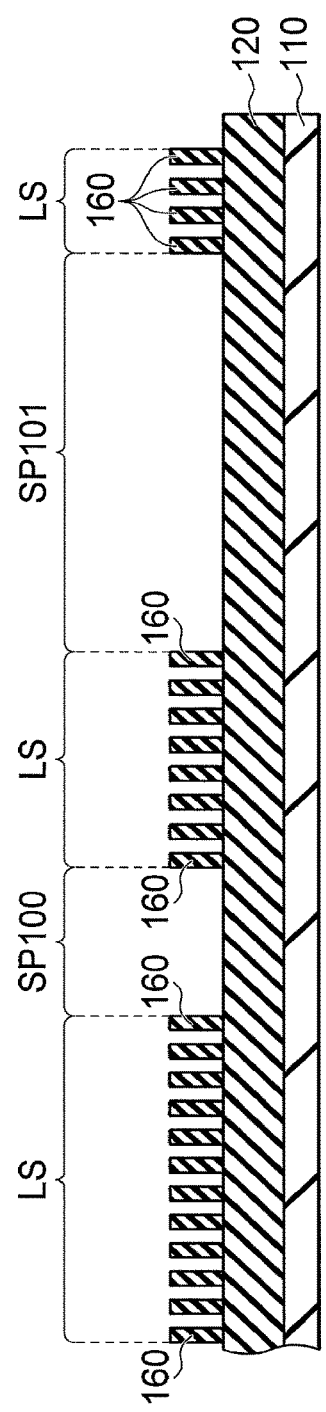

Thereafter, the hard mask elements 130 are removed. The removal leaves the sidewall films 160 on the surface of the object film 120, as shown in FIG. 19B. In FIG. 19B, spaces in a line and space pattern LS are relatively narrow and space regions SP100 and SP101 are relatively wide.

Figure 19C:
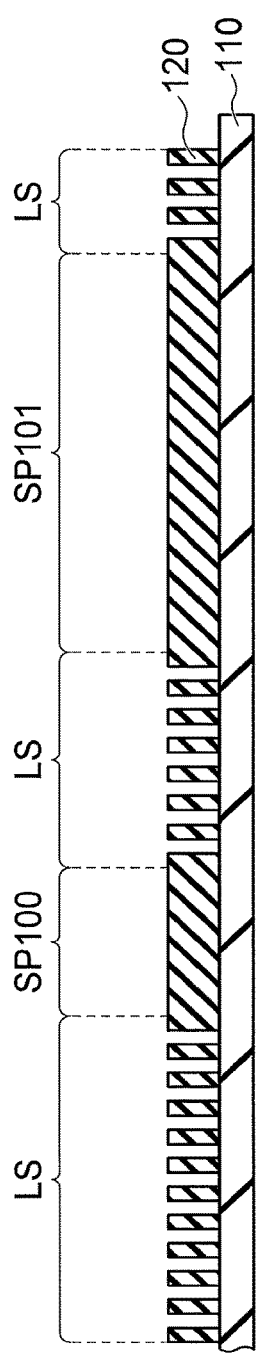

Subsequently, the object film 120 is processed using the sidewall films 160 as masks. The object film 120 is etched using the inverse loading effect. As a result, the object film 120 is processed in accordance with the line and space pattern LS in the corresponding regions in FIG. 19B. On the other hand, the object film 120 is not etched very much in the space regions SP100 and SP101. Therefore, the line and space pattern LS formed by the sidewall films 160 is transferred to the object film 120, except for the portions corresponding to the space regions SP100 and SP101, as shown in FIG. 19C.

The object film 120 may further be used as a hard mask for processing the base layer 110. Alternatively, a wiring material may be filled into the pattern of the object film 120 to form wiring lines. Thereafter, such elements as interlayer dielectric films and wiring layers are formed to complete the semiconductor device according to the fourth embodiment. As described above, the effect of the fourth embodiment is not lost if the sidewall transfer process is performed twice, and the inverse loading effect is used in the second process.

(First Modification)

Figure 20:
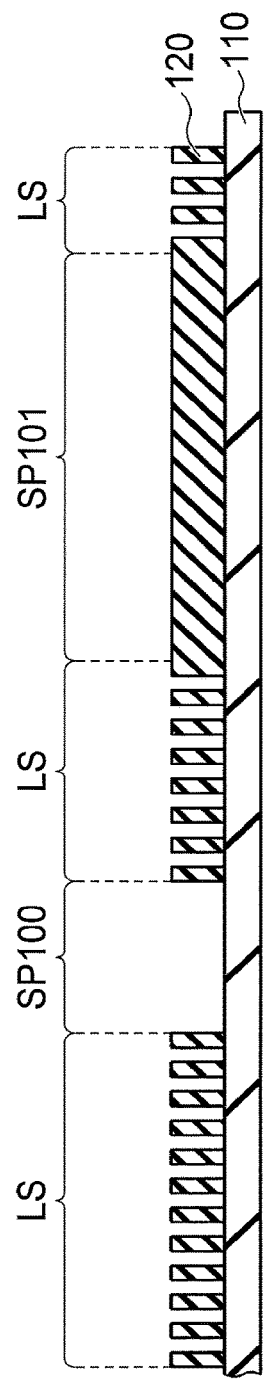
FIG. 20 is a cross-sectional view showing a semiconductor device manufacturing method according to a first modification of the fourth embodiment.

FIG. 20 is a cross-sectional view showing a semiconductor device manufacturing method according to a first modification of the fourth embodiment. In this modification, after the steps shown in FIGS. 18A to 19B, the object film 120 is processed using the sidewall films 160 as masks. The object film 120 is etched using the inverse loading effect. In this modification, the object film 120 is processed in accordance with the pattern of the sidewall films 160 in the regions corresponding to the line and space pattern LS and the space region SP100. On the other hand, the object film 120 is not etched very much in the space region SP101, which is broader than the space region SP100. As a result, the line and space pattern of the sidewall films 160 and the pattern of the space region SP100 are transferred to the object film 120, except for the portions corresponding to the space region SP101, as shown in FIG. 20.

(Second Modification)

FIGS. 21A to 22C are cross-sectional views illustrating a semiconductor device manufacturing method according to a second modification of the fourth embodiment. In the second modification, after the steps shown in FIGS. 18A to 18C, the hard mask 130 is processed using the sidewall films 150 as masks, and employing the inverse loading effect. As a result, the hard mask 130 is processed in accordance with the line and space pattern LS as shown in FIG. 21A. On the other hand, the hard mask 130 is not etched very much in the space regions SP100 and SP101. Therefore, the line and space pattern of the sidewall films 150 is transferred to the hard mask 130 in the regions other than the space regions SP100 and SP101, as shown in FIG. 21B.

Figure 22A:
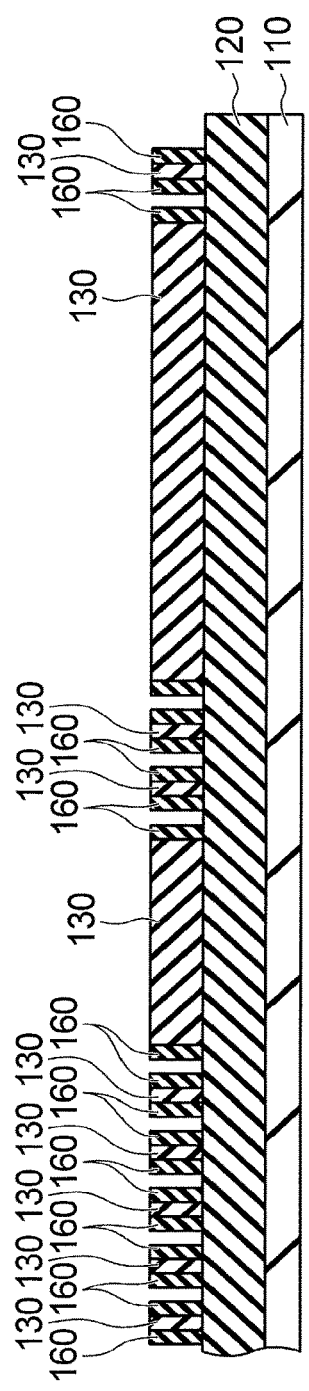

Thereafter, the processed hard mask 130 is slimmed to decrease their width. A material of sidewall films 160 is deposited on top surfaces and side surfaces of the slimmed hard mask 130, and etching back of the material of the sidewall films 160 is performed. The etching back leaves the sidewall films 160 on the side surfaces of the hard mask elements 130, as shown in FIG. 22A.

Figure 22B:
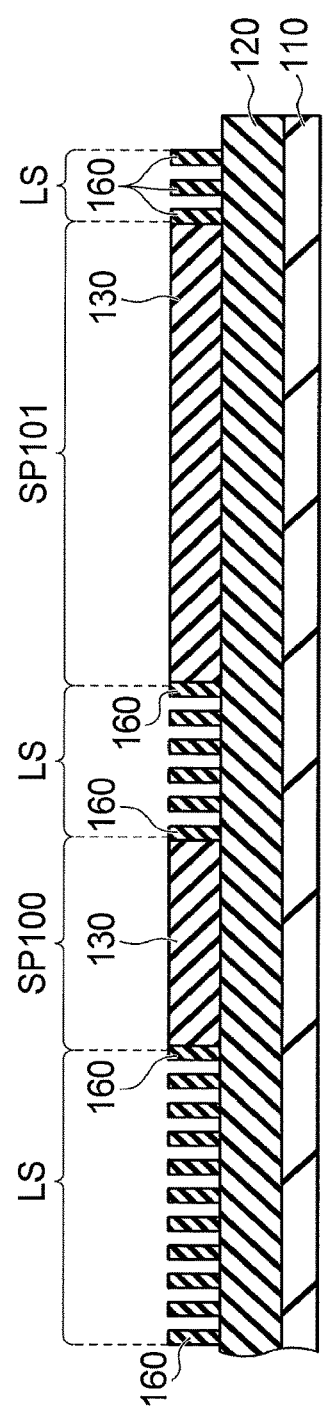

Subsequently, the hard mask 130 is etched by using the inverse loading effect. As a result, the hard mask 130 is removed, and the sidewall films 160 are left in the regions of the line and space pattern LS as shown in FIG. 22B. On the other hand, the hard mask elements 130 are left in the space regions SP100 and SP101.

Figure 22C:
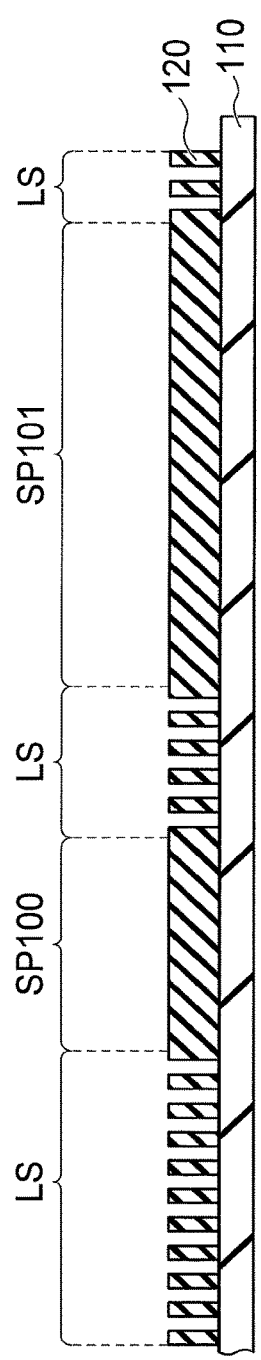

Thereafter, the object film 120 is processed using the sidewall films 160 and the hard mask 130 as masks. In this process, the pattern of the sidewall films 160 and the hard masks 130 is transferred to the object film 120 without using the inverse loading effect. As a result, the object film 120 is processed in accordance with the line and space pattern LS in the regions of the line and space pattern LS as shown in FIG. 22C. On the other hand, the object film 120 is not etched in the space regions SP100 and SP101.

Thereafter, the object film 120 may be used as a hard mask for processing the base layer 110. Alternatively, a wiring material may be filled into the pattern of the object film 120 to form wiring lines. Subsequently, such elements as interlayer insulating films and wiring layers are formed to complete the semiconductor device according to this modification.

Thus, the effect of the fourth embodiment is not lost if the inverse loading effect is used in the first of the two sidewall transfer processes.

(Third Modification)

Figure 23A:
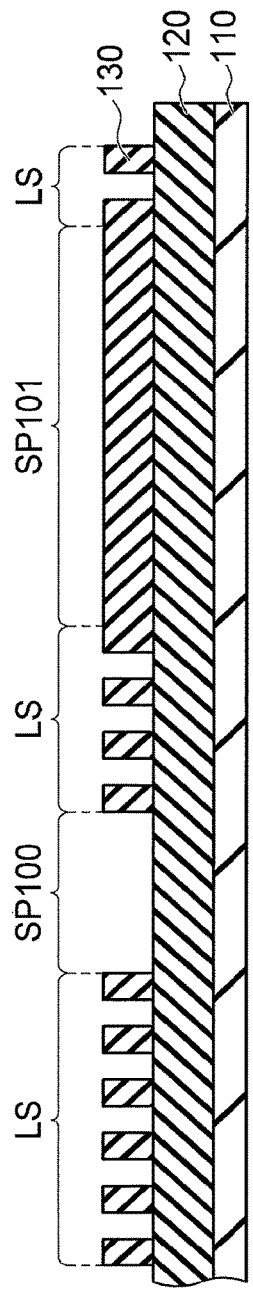
FIGS. 23A to 23D are cross-sectional views illustrating a semiconductor device manufacturing method according to a third modification of the fourth embodiment.

FIGS. 23A to 23D are cross-sectional views illustrating a semiconductor device manufacturing method according to a third modification of the fourth embodiment. In the third modification, after the steps shown in FIGS. 18A to 18C, the hard mask 130 is processed using the sidewall films 150 as masks, and employing the inverse loading effect. In the third modification, however, the hard mask 130 is processed in accordance with the pattern of the sidewall films 150 both in the line and space pattern LS and the space region SP100. On the other hand, in the space region SP101, which is broader than the space region SP100, the hard mask 130 is not etched very much. As a result, the pattern of the sidewall films 150 is transferred to the hard mask 130 in the regions other than the space region SP101, i.e., the region of the line and space pattern LS and the space region SP100 as shown in FIG. 23A.

Figure 23B:
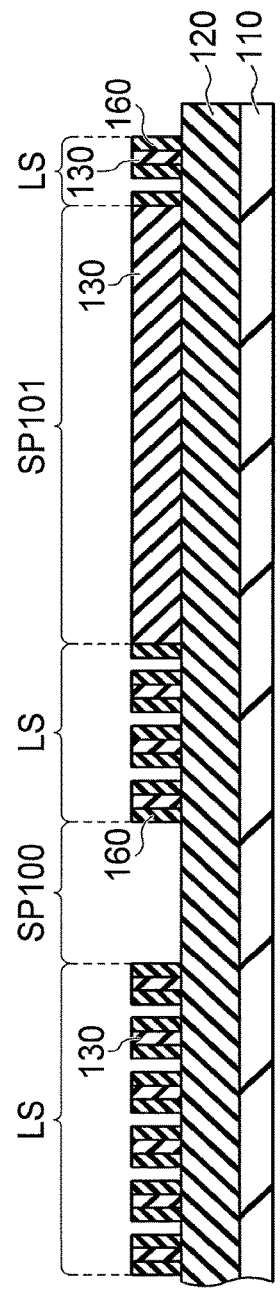

Thereafter, each of the hard mask elements 130 is slimmed to decrease its width. A material of sidewall films 160 is deposited on top surfaces and side surfaces of the slimmed hard mask elements 130, and etching back of the material of the sidewall films 160 is performed. As a result, the sidewall films 160 are left on the side surfaces of the hard mask elements 130, as shown in FIG. 23B.

Figure 23C:
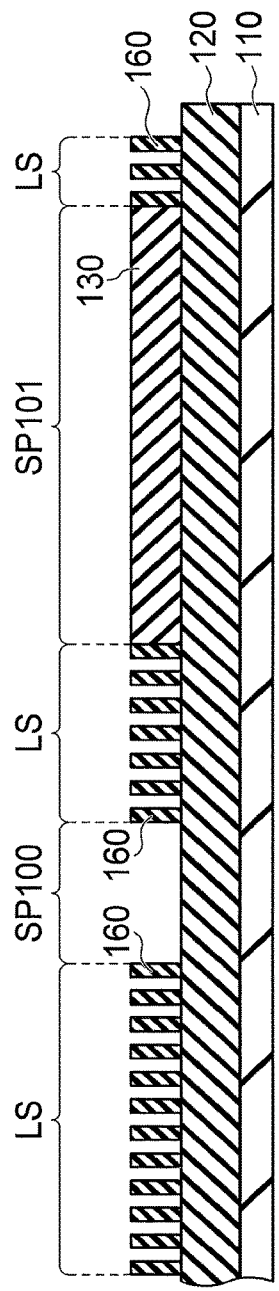

Subsequently, the hard mask elements 130 are etched by using the inverse loading effect. As a result, the hard mask elements 130 are removed and the sidewall films 160 are left in the regions of the line and space pattern LS as shown in FIG. 23C. In the space region SP101, the hard mask elements 130 are left.

Figure 23D:
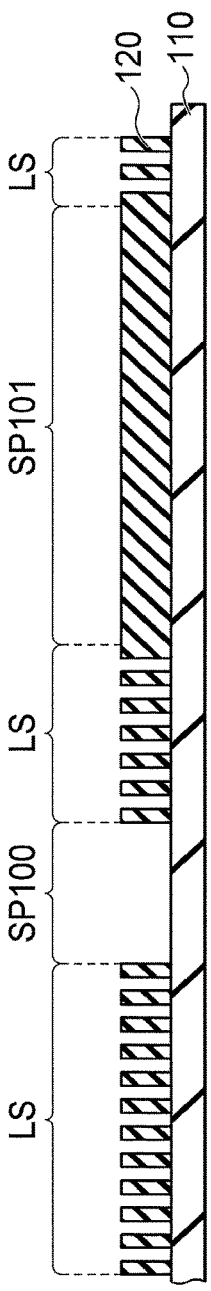

Thereafter, the object film 120 is processed using the sidewall films 160 and the hard mask 130 as masks. During this process, the inverse loading effect is not used, but the pattern of the sidewall films 160 and the hard mask 130 is transferred to the object film 120. As a result, the object film 120 is processed in accordance with the line and space pattern LS and the pattern of the space region SP100, as shown in FIG. 23D. On the other hand, the object film 120 is not etched in the space region SP101, in which the hard mask element 130 is left.

Thereafter, a wiring material may be filled into the pattern of the object film 120 to form wiring lines. Alternatively, the object film 120 may be used as a hard mask for processing the base layer 110. Subsequently such elements as interlayer insulating films and wiring layers may be formed to complete the semiconductor device according to this modification.

As described above, the hard mask elements 130 may be left in the space region SP101 by using the difference in width between the space region SP100 and the space region SP101, employing the inverse loading effect.

(Fourth Modification)

Figure 24:
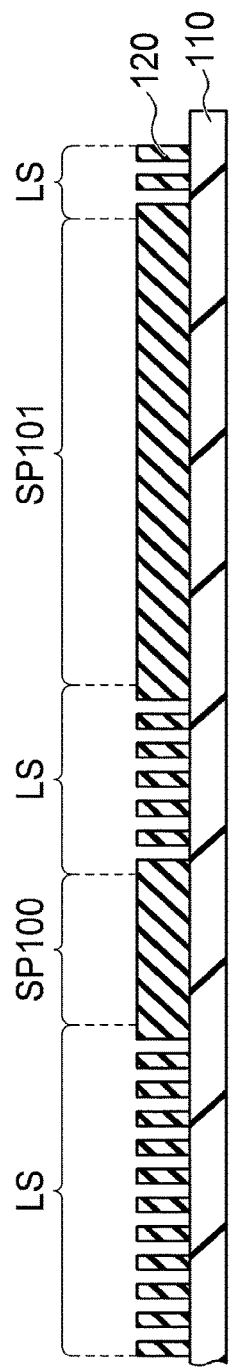
FIG. 24 is a cross-sectional view illustrating a semiconductor device manufacturing method according to a fourth modification of the fourth embodiment.

FIG. 24 is a cross-sectional view illustrating a semiconductor device manufacturing method according to a fourth modification of the fourth embodiment. In the fourth modification, after the step shown in FIG. 23C in the third modification, the object film 120 is processed using the sidewall films 160 and the hard mask element 130 as masks, and employing the inverse loading effect. As a result, the object film 120 is left in the space region SP100 as shown in FIG. 24. In the regions other than the space region SP100, i.e., the regions of the line and space pattern SL and the space region SP101, the patterns of the sidewall films 160 and the hard mask 130 are transferred to the object film 120.

Thus, if the inverse loading effect is employed in both the first and second sidewall transfer processes, the effect of the fourth embodiment is not lost.

In the fourth embodiment and the first to fourth modifications thereof, the sidewall transfer process is performed twice, of which at least one process employs the inverse loading effect to process the hard mask 130 and/or the object film 120. Depending on in which process the inverse loading effect is employed, the pattern of the object film 120 in the space regions SP100 and SP101, or the line and space pattern LS of the object film 120 in the vicinity of the space regions SP100 and SP101 slightly changes, as may be understood from the comparison among FIGS. 19C, FIG. 20, FIG. 22C, FIG. 23D, and FIG. 24. Thus, the shapes of the space regions and the regions of the line and space pattern may be slightly changed by applying or not applying the inverse loading effect to the sidewall transfer processes.

Although the sidewall transfer process is performed twice in the fourth embodiment, the inverse loading effect may be employed in three or more sidewall transfer processes.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
    a first wiring line provided on a first layer in a first direction;
    a second wiring line provided on the first layer in the first direction, and the second wiring line having a first side surface facing the first wiring line and a second side surface which is opposite to the first side surface;
    a third wiring line provided on the first layer in the first direction, and immediately adjacent to the second side surface of the second wiring line;
    a fourth wiring line provided on the first layer in the first direction, the fourth wiring line having a first side surface immediately adjacent to the third wiring line and a second side surface which is opposite to the first side surface, the first side surface of an end portion of the fourth wiring line is rounded and curves toward the third wiring line;
    a fifth wiring line provided on the first layer in the first direction, the second side surface of the fourth wiring line facing the fifth wiring line, wherein an end portion of the fifth wiring line projects further from the end portion of the fourth wiring line in the first direction; and
    a sixth wiring line, a seventh wiring line, and an eighth wiring line, wherein end portions of the sixth wiring line, the seventh wiring line, and the eighth wiring line are symmetrical to the end portions of the second wiring line, the third wiring line, and the fourth wiring line about an axis perpendicular to the first direction, wherein
    an end portion of the first wiring line projects further from an end portion of the second wiring line in the first direction,
    the end portion of the second wiring line projects further from an end portion of the third wiring line in the first direction, and the first and second side surfaces of the end portion of the second wiring line are rounded and curve toward the third wiring line,
    the end portion of the second wiring line curves along a side surface of the third wiring line, and
    the end portion of the fourth wiring line curves along a side surface of the third wiring line.

2. The semiconductor device according to claim 1, wherein the end portion of the second wiring line curves toward one side.

3. The semiconductor device according to claim 1, wherein a tip portion of the second wiring line is located between a substantially middle portion in a space pattern, which is between the second wiring line and the third wiring line, and substantially a middle portion of the second wiring line.

4. The semiconductor device according to claim 2, wherein a tip portion of the second wiring line is located between a substantially middle portion in a space pattern, which is between the second wiring line and the third wiring line, and substantially a middle portion of the second wiring line.

5. The semiconductor device according to claim 1, wherein a width of a space region facing the first wiring line that is adjacent to the second wiring line and the third wiring line is greater than a sum of a width of a first space pattern area between the first wiring line and the second wiring line, a line width of the second wiring line, a width of a second space pattern area between the second wiring line and the third wiring line, and a line width of the third wiring line.

6. The semiconductor device according to claim 2, wherein a width of a space region facing the first wiring line that is adjacent to the second wiring line and the third wiring line is greater than a sum of a width of a first space pattern area between the first wiring line and the second wiring line, a line width of the second wiring line, a width of a second space pattern area between the second wiring line and the third wiring line, and a line width of the third wiring line.

7. The semiconductor device according to claim 3, wherein a width of a space region facing the first wiring line that is adjacent to the second wiring line and the third wiring line is greater than a sum of a width of a first space pattern area between the first wiring line and the second wiring line, a line width of the second wiring line, a width of a second space pattern area between the second wiring line and the third wiring line, and a line width of the third wiring line.

8. The semiconductor device according to claim 1, wherein a sum of a width of a first space pattern area between the first wiring line and the second wiring line and a width of the second wiring line is less than 40 nm, and a sum of a width of a second space pattern area between the second wiring line and the third wiring line and a width of the third wiring line is less than 40 nm.

9. The semiconductor device according to claim 2, wherein a sum of a width of a first space pattern area between the first wiring line and the second wiring line and a width of the second wiring line is less than 40 nm, and a sum of a width of a second space pattern area between the second wiring line and the third wiring line and a width of the third wiring line is less than 40 nm.

10. The semiconductor device according to claim 3, wherein a sum of a width of a first space pattern area between the first wiring line and the second wiring line and a width of the second wiring line is less than 40 nm, and a sum of a width of a second space pattern area between the second wiring line and the third wiring line and a width of the third wiring line is less than 40 nm.

* * * * *